United States Patent [19]
Pluymers et al.

[11] Patent Number: 6,081,988
[45] Date of Patent: Jul. 4, 2000

[54] FABRICATION OF A CIRCUIT MODULE WITH A COAXIAL TRANSMISSION LINE

[75] Inventors: Brian Alan Pluymers, Morrestown, N.Y.; Doreen Marie Nixon, Bensalem, Pa.

[73] Assignee: Lockheed Martin Corp., Moorestown, N.J.

[21] Appl. No.: 09/070,033

[22] Filed: Apr. 30, 1998

[51] Int. Cl.[7] .................................................. H01Q 17/00
[52] U.S. Cl. ............................ 29/601; 29/830; 29/832; 29/840
[58] Field of Search .................... 29/828, 830, 832, 29/890, 601

[56] References Cited

U.S. PATENT DOCUMENTS

| | | | |
|---|---|---|---|
| 3,679,941 | 7/1972 | LaCombe et al. | 317/101 A |
| 3,805,375 | 4/1974 | LaCombe et al. | 29/577 |
| 4,597,029 | 6/1986 | Kucharek et al. | 361/407 |
| 4,603,345 | 7/1986 | Lee et al. . | |
| 4,922,325 | 5/1990 | Smeltz, Jr. . | |
| 4,933,743 | 6/1990 | Thomas et al. . | |
| 4,996,588 | 2/1991 | Malbe et al. . | |
| 5,111,278 | 5/1992 | Eichelberger . | |
| 5,285,017 | 2/1994 | Gardner | 174/261 |
| 5,306,670 | 4/1994 | Mowatt et al. | 29/832 |
| 5,336,930 | 8/1994 | Quach | 257/774 |
| 5,353,195 | 10/1994 | Fillion et al. . | |
| 5,353,498 | 10/1994 | Fillion et al. | 29/840 |
| 5,386,088 | 1/1995 | Gardner | 174/261 |
| 5,414,221 | 5/1995 | Gardner | 174/261 |
| 5,455,384 | 10/1995 | Ichihara | 174/52.2 |
| 5,468,917 | 11/1995 | Brodsky et al. | 174/255 |
| 5,524,339 | 6/1996 | Gorowitz et al. | 29/840 |
| 5,527,741 | 6/1996 | Cole et al. | 29/832 |
| 5,530,285 | 6/1996 | Brenndoerfer | 257/691 |
| 5,552,632 | 9/1996 | Iwasaki | 257/679 |
| 5,653,841 | 8/1997 | Krishnamurthy et al. | 29/832 |
| 5,776,275 | 7/1998 | Krishnamurthy et al. . | |

FOREIGN PATENT DOCUMENTS

| | | |
|---|---|---|
| 0396152 | 3/1986 | European Pat. Off. . |
| 0457985 | 8/1990 | European Pat. Off. . |
| 2507409 | 6/1981 | France . |

Primary Examiner—Carl J. Arbes
Attorney, Agent, or Firm—W. H. Meise; S. D. Weinstein

[57] ABSTRACT

Interconnections are made through a planar circuit by a monolithic short-circuited transmission path which extends from a circuit portion of the planar circuit to the opposite side. The opposite side is ground sufficiently to remove the short-circuiting plate, thereby separating the previously monolithic conductors, and exposing ends of the separated conductors of the transmission path. Connection is made between the exposed conductors of the transmission path and the registered contacts of a second planar circuit by means of electrically conductive, compliant fuzz buttons. The transmission path may be a coaxial path useful for RF.

10 Claims, 19 Drawing Sheets

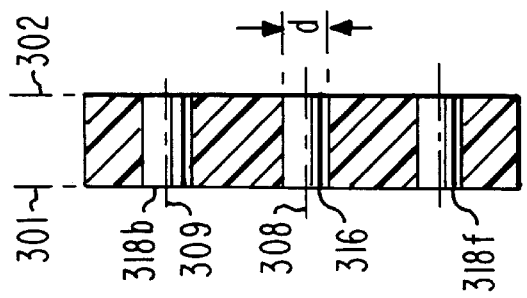
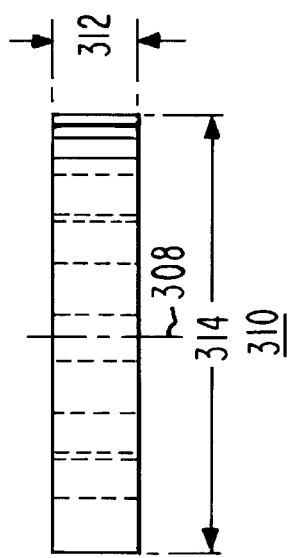
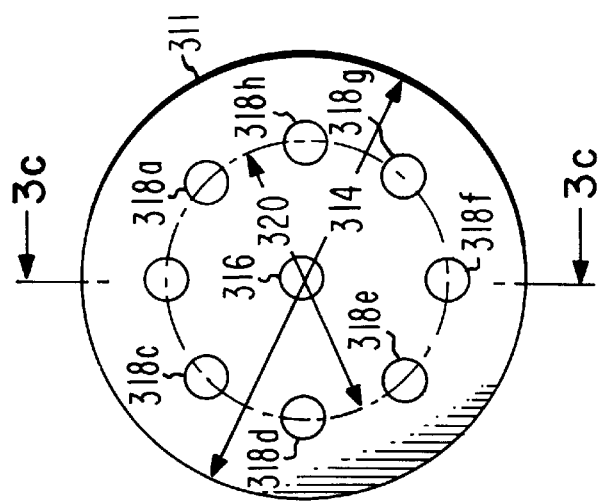

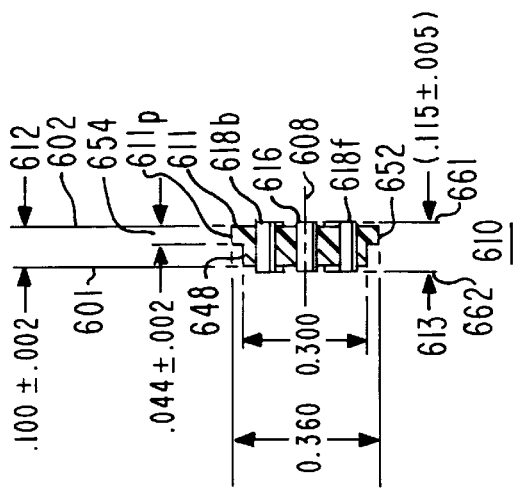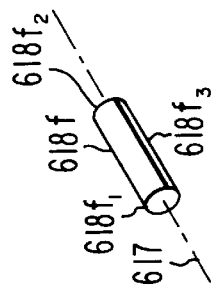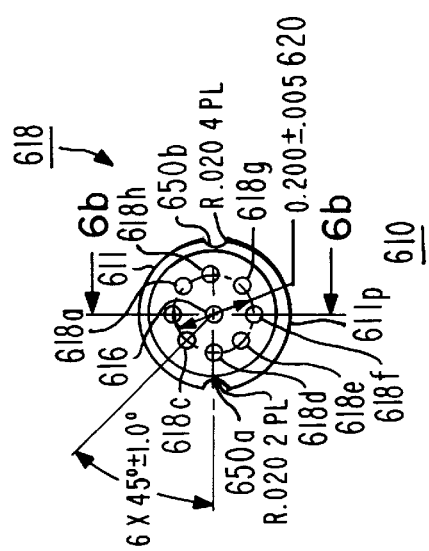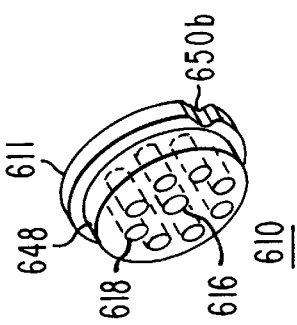

FABRICATION OF A CIRCUIT MODULE WITH A COAXIAL TRANSMISSION LINE

FIELD OF THE INVENTION

This invention relates to RF (including microwave) interconnections among layers of assemblies of multiple integrated circuits, and more particularly to interconnection arrangements which may be sandwiched between adjacent circuits.

BACKGROUND OF THE INVENTION

Active antenna arrays are expected to provide performance improvements and reduce operating costs of communications systems. An active antenna array includes an array of antenna elements. In this context, the antenna element may be viewed as being a transducer which converts between free-space electromagnetic radiation and guided waves. In an active antenna array, each antenna element, or a subgroup of antenna elements, is associated with an active module. The active module may be a low-noise receiver for low-noise amplification of the signal received by its associated antenna element(s), or it may be a power amplifier for amplifying the signal to be transmitted by the associated antenna element(s). Many active antenna arrays use transmit-receive (T/R) modules which perform both functions in relation to their associated antenna elements. The active modules, in addition to providing amplification, ordinarily also provide amplitude and phase control of the signals traversing the module, in order to point the beam(s) of the antenna in the desired direction. In some arrangements, the active module also includes filters, circulators, andor other functions.

A major cost driver in active antenna arrays is the active transmit or receive, or T/R module. It is desirable to use monolithic microwave integrated circuits (MMIC) to reduce cost and to enhance repeatability from element to element of the array. Some prior-art arrangements use ceramic-substrate high-density-interconnect (HDI) substrate for the MMICs, with the substrate mounted to a ceramic, metal, or metal-matrix composite base for carrying away heat. These technologies are effective, but the substrates may be too expensive for some applications.

FIG. 1 illustrates a cross-section of an epoxy-encapsulated HDI module 10 in which a monolithic microwave integrated circuit (MMIC) 14 is mounted by way of a eutectic solder junction 16 onto the top of a heat-transferring metal deep-reach shim 18. The illustrated MMIC 14, solder 16, and shim 18 are encapsulated, together with other like MMIC, solder and shim assemblies (not illustrated) within a plastic encapsulant or body 12, the material of which may be, for example, epoxy resin. The resulting encapsulated part, which may be termed "HDI-connected chips" inherently has, or the BP DN lower surfaces are ground and polished to generate, a flat lower surface $12_{ls}$ BP DN. The flat lower surface $12_{ls}$, and the exposed lower surface $18_{ls}$ of the shim, are coated with a layer 20 of electrically and thermally conductive material, such as copper or gold. As so far described, the module 10 of FIG. 1 has a plurality of individual MMIC mounted or encapsulated within the plastic body 12, but no connections are provided between the individual MMICs or between any one MMIC and the outside world. Heat which might be generated by the MMIC, were it operational, would flow preferentially through the solder junction 16 and the shim 18 to the conductive layer 20.

In FIG. 1, the upper surface of MMIC 14 has two representative electrically conductive connections or electrodes $14_1$ and $14_2$. Connections are made between electrodes $14_1$ and $14_2$ and the corresponding electrodes (not illustrated) of others of the MMICs (not illustrated) encapsulated within body 12 by means of HDI technology, including flexible layers of KAPTON on which traces or patterns of conductive paths, some of which are illustrated as $32_1$ and $32_2$, have been placed, and in which the various layers are interconnected by means of conductive vias. In FIG. 1, KAPTON layers 24, 26, and 30 are provided with paths defined by traces or patterns of conductors. The layers illustrated as 24 and 26 are bonded together to form a multilayer, double-sided structure, with conductive paths on its upper and lower surfaces, and additional conductive paths lying between layers 24 and 26. Double-sided layer 24/26 is mounted on upper surface $12_{us}$ of body 12 by a layer 22 of adhesive. A further layer 30 of KAPTON, with its own pattern of electrically conductive traces $32_2$, is held to the upper surface of double-sided layer 24/26 by means of an adhesive layer 28. The uppermost layer of electrically conductive traces may include printed antenna elements in one embodiment of the invention. As mentioned above, electrical connections are made between the conductive traces of the various layers, and between the traces and appropriate ones of the MMIC contacts $14_1$ and $14_2$, by through vias, some of which are illustrated as 36. The items designated MT0, MT1, MT2, and MT3 at the left of FIG. 1 are designations of various ones of the flexible sheets carrying the various conductive traces. Those skilled in the art will recognize this structure as being an HDI interconnection arrangement, which is described in U.S. Pat. No. 5,552,633, issued Sep. 3, 1996 in the name of Sharma.

As illustrated in FIG. 1, at least one radio-frequency (RF) ground conductor layer or "plane" 34 is associated with lower layer 24 of the double-sided layer 24/26. Those skilled in the art will realize that the presence of ground plane 34 allows ordinary "microstrip" transmission-line techniques to carry RF signals in lateral directions, parallel with upper surface $12_{us}$ of plastic body 12, so that RF signals can also be transmitted from one MMIC to another in the assembly 10 of FIG. 1.

Allowed U.S. patent application Ser. No. 08/815,349, in the name of McNulty et al., describes an arrangement by which signals can be coupled to and from an HDI circuit such as that of FIG. 1. As described in the McNulty et al. application, the HDI KAPTON layers with their patterns of conductive traces are lapped over an internal terminal portion of a hermetically sealed housing. Connections are made within the body of the housing between the internal terminal portion and an externally accessible terminal portion.

One of the advantages of an antenna array is that it is a relatively flat structure, by comparison with the three-dimensional curvature of reflector-type antennas. When assemblies such as that of FIG. 1 are to be used for the transmit-receive modules of an active array antenna, it is often desirable to keep the structure as flat as possible, so as, for example, to make it relatively easy to conform the antenna array to the outer surface of a vehicle. FIG. 2a illustrates an HDI module such as that described in the abovementioned McNulty patent application. In FIG. 2a, representative module 210 includes a mounting base 210, to which heat is transferred from internal chips. A plurality of mounting holes are provided, some of which are designated 298. A contoured lid 213 is hermetically sealed to a peripheral portion of base 212, to protect the chips within. A first set of electrical connection terminals, some of which are designated as 222a, 224a, and 226a are illustrated as being located on the near side of the base, and a similar set of connection terminals, including terminals designated as 222b, 224b, and 226b are located on the remote side of the base. FIG. 2b is a perspective or isometric view, partially exploded, of an active array antenna 200. In FIG. 2b, the rear or reverse side (the non-radiating or connection side) of a flat antenna element structure 202 is shown, divided into rows designated a, b, c, and d and columns 1, 2, 3, 4, and 5. Each location of array structure 202 is identified by its row and column number, and each such location is associated with a set of terminals, three in number for each location. Each array location of antenna element array 202 is associated with an antenna element, which is on the obverse or front side of structure 202. Each antenna element on the obverse side of the antenna element structure 202 is connected to the associated set of three terminals on the corresponding row and column of the reverse side of the antenna element array 202. Each antenna element of active antenna array 200 of FIG. 2b is associated with a corresponding active antenna module 210, only one of which is illustrated. In FIG. 2b, active antenna module 210b3 is associated with antenna element or array element 202b3. Active module 210b3 is identical to module 210 of FIG. 2a and to all of the other modules (not illustrated) of FIG. 2b. Representative module 210b3 has its terminals 222a, 224a, and 226a connected by means of electrical conductors to the set of three terminals associated with array element 202b3 of antenna structure 202. The other set of terminals of module 210b3, namely the set including terminals 222b, 224b, and 226b, is available to connect to a source or sink of signals which are to be transmitted or received, respectively. It will be clear that the orientation of module 210b3, and of the other modules which it represents, will, when all present, will extend for a significant distance behind or to the rear of the antenna element support structure 202, thereby tending to make the active antenna array 200 fairly thick. Also, the presence of the many modules will make it difficult to support the individual modules in a manner such that heat can readily be extracted from the mounting plates (212 of FIG. 2a). Also, the presence of many such active modules 210 will make it difficult to make the connections between the terminal sets of the active modules and the terminal sets of the antenna elements. The problem of thickness of the structure of FIG. 2b is exacerbated by the need for a signal distribution arrangement, partially illustrated as 290. Distribution arrangement 290 receives signal from a source 292, and distributes some of the signal to the near connections of each of the modules, such as connections 222b, 224b, and 226b of module 210b3.

A further problem with the structure of FIG. 2b is that the connections between the active module 210b3 and the set of terminals for array element 202b3 is by way of an open transmission-line. Those skilled in the art of RF and microwave communications know that such open transmission-lines tend to be lossy, and in a structure such as that illustrated in FIG. 2b, the losses will tend to result in cross-coupling of signal between the terminals of the various array elements.

A further problem with interconnecting the structure of FIG. 2b is that of tolerance build-up between the antenna terminal sets on the reverse side of the antenna element structure 202, the terminals of the modules 210, and the terminals of beamformer 290.

Improved arrangements are desired for producing flat HDI-connected structures which can be arrayed with other flat structures.

SUMMARY OF THE INVENTION

A short-circuited transmission line according to an aspect of the invention includes a monolithic, electrically conductive structure including (a) a solid center conductor having a circular cross-section about a central axis. The center conductor terminates at a first plane and has a first diameter at the first plane in a direction transverse to the central axis, and a second diameter, greater than the first diameter, at a second plane parallel to the first plane. The diameter of the center conductor tapers monotonically between the first and second diameters. The length of the center conductor is defined by the separation of the first and second planes. The monolithic structure further includes (b) a plurality of mutually identical solid outer conductors. Each one of the outer conductors has a circular cross-section about a longitudinal axis. The longitudinal axes of the outer conductors are parallel with the central axis of the center conductor. Each of the outer conductors terminates at the first plane, and has a third diameter at the first plane, and a fourth diameter, greater than the third diameter, at the second plane. The diameter of the outer conductors tapers monotonically between the first and second diameters. The outer conductors have their longitudinal axes equally spaced from each other at radii which make equal angles with adjacent radii. The monolithic structure also includes (c) a solid short-circuiting plate interconnecting the center conductor and the outer conductors at the second plane.

In a particular embodiment of the invention, the third diameter equals the first diameter, and the fourth diameter equals the second diameter, and the taper of the diameters of the center and outer conductors is linear. In another embodiment of the invention, the short-circuiting plate has a thickness no greater than the length of the center conductor. The periphery of the short-circuiting plate may be defined by a radius measured from the central axis of the center conductor, which radius is equal to the sum of (a) one of the radii plus (b) half of the greater of (i) the second diameter and (ii) the fourth diameter. In yet another embodiment, the length of the center conductor is no greater than the diameter of the dielectric insulator.

In one embodiment, a disk-like dielectric insulator encapsulates the monolithic structure. The insulator defines a central axis coincident with the central axis of the center conductor, a thickness sufficient to enclose that portion of the center and outer conductors lying between the first and second planes, and a periphery defined, at least in part, by a radius from the central axis sufficient to encapsulate the sides at the greatest taper, which is a radius which is greater than the sum of (a) one of the radii plus (b) half of the greater of (i) the second diameter and (ii) the fourth diameter. In one embodiment of the invention, the second and fourth diameters are equal, so the radius of the encapsulating insulator is equal to the radius of the circles on which the outer conductor axes lie, plus half the diameter of a conductor at the second plane. The insulator surrounds at least portions of the center and outer conductors, for insulating the center conductor from the outer conductors and the outer conductors from each other, except at the short-circuiting plate. The dielectric insulator may be either rigid or deformable, as an elastomer.

A method for producing a flat antenna array according to another aspect of the invention includes the step of affixing a plurality of microwave integrated-circuit chips to a planar support, with connections of the chips adjacent to the support. A short electrical transmission-line is procured. The electrical transmission-line includes
  (i) a monolithic, electrically conductive structure which includes
    (a) a solid center conductor having a circular cross-section about a central axis, and terminating in a first end at a first plane. The center conductor has a first diameter at a first plane transverse to the central axis, and a second diameter, greater than the first diameter, at a second plane parallel to the first plane. The diameter of the center conductor tapers monotonically between the first and second diameters. The length of the center conductor is defined by the separation of the first and second planes, (b) a plurality of mutually identical solid outer conductors. Each one of the outer conductors has a circular cross-section about a longitudinal axis, and the longitudinal axes of the outer conductors lie parallel with the central axis of the center conductor. Each of the outer conductors terminates at a first end at the first plane, and the first ends of the outer conductors have a third diameter at the first plane. The outer conductors have a fourth diameter, greater than the third diameter, at the second plane. The diameter of the outer conductors tapers monotonically between the third and fourth diameters. The outer conductors have their longitudinal axes equally spaced from each other at radii which make equal angles with adjacent radii.

(c) a solid short-circuiting plate interconnecting the center conductor and the outer conductors at the second plane.

In a particular embodiment of the invention, the electrical transmission line also includes (ii) a disk-like dielectric insulator defining a central axis coincident with the central axis of the center conductor, and a thickness sufficient to enclose that portion of the center and outer conductors lying between the first and second planes. The periphery of the disk-like dielectric insulator is defined, at least in part, by a radius from the central axis which is sufficient to enclose the all the outer conductors at their greatest diameter. This radius is no less than the sum of (a) one of the radii plus (b) half of the greater of (i) the second diameter and (ii) the fourth diameter. The insulator, when used, surrounds at least portions of the center and outer conductors in the axial direction, for insulating the center conductor from the outer conductors and the outer conductors from each other, but no electrical insulation between the conductors exists at the short-circuiting plate.

The method includes the step of applying the short transmission-line to the support with the first ends adjacent the support, and encapsulating the chips and the short transmission-line in rigid dielectric material, to thereby produce a structure including an encapsulated chip and transmission-line. At least portions of the support are removed from the encapsulated chip and transmission-line, to thereby expose at least portions of a first side of the encapsulated chip and transmission-line, including at least the connections of the chips and the first ends of the center and outer conductors of the short transmission-line. If the support lacks conductive traces, a layer of flexible dielectric sheet carrying a plurality of electrically conductive traces is applied to the first side of the encapsulated chip and transmission-line. At least one of the connections of at least one of the chips is interconnected with the first end of the center conductor of the transmission-line, and at least one other of the connections of the one of the chips is interconnected to the first ends of all of the outer conductors of the transmission-line, by way of some of the traces and through vias, to thereby produce a first-side-connected encapsulated arrangement. At least so much material is removed from that side of the first-side-connected encapsulated arrangement which is remote from the first side as will expose separated second ends, remote from the first ends, of the center and outer conductors of the transmission-line, to thereby produce a first planar arrangement having exposed second ends of the center and outer conductors of the transmission-line. A planar conductor arrangement including a plurality of individual electrical connections is applied over the first planar arrangement, adjacent the side of the first planar arrangement with exposed second ends of the center and outer conductors. The electrical connections of the planar conductor are selected so that, when the planar conductor arrangement is registered with the first planar arrangement, the electrical connections are registered with the center and outer conductors of the transmission-line. The planar conductor arrangement is registered with the first planar arrangement, and electrical connections are made between the second ends of the center and outer conductors of the transmission line of the first planar arrangement and the connections of the planar conductor arrangement.

In a particular method according to an aspect of the invention, the step of making electrical connections includes the steps of placing a compressible floccule of electrically conductive material between the second ends of each of the center and outer conductors of the transmission line of the first planar arrangement and the registered ones of the electrical connections of the planar conductor arrangement, and compressing the compressible floccule of electrically conductive material between the second ends of the center and outer conductors of the transmission lines of the first planar arrangement and the registered ones of the electrical connections of the planar conductor arrangement, to thereby establish the electrical connections and to aid in holding the compressible floccules in place. In a preferred embodiment of the invention, the method encapsulates the chips and the short transmission-line in the same dielectric material used in the dielectric disk.

BRIEF DESCRIPTION OF THE DRAWING

FIGS. 3a and 3b are simplified plan and elevation views, respectively, of a short transmission-line, and FIG. 3c is a cross-section of the structure of FIG. 3a taken along section lines 3c—3c.

FIG. 6a is a simplified plan view of a compressible or conformable short transmission line, FIG. 6b is a simplified cross-section of the arrangement of FIG. 6a taken along section lines 6a—6a, FIG. 6c is a simplified perspective or isometric view of the short transmission line of FIGS. 6a and 6b, with the fuzz button conductors illustrated in phantom, and FIG. 6d is a simplified perspective or isometric view of a representative fuzz button;

FIG. 10b illustrates the result of further fabrication steps applied to the structure of FIG. 10a;

DESCRIPTION OF THE INVENTION

Figure 1:
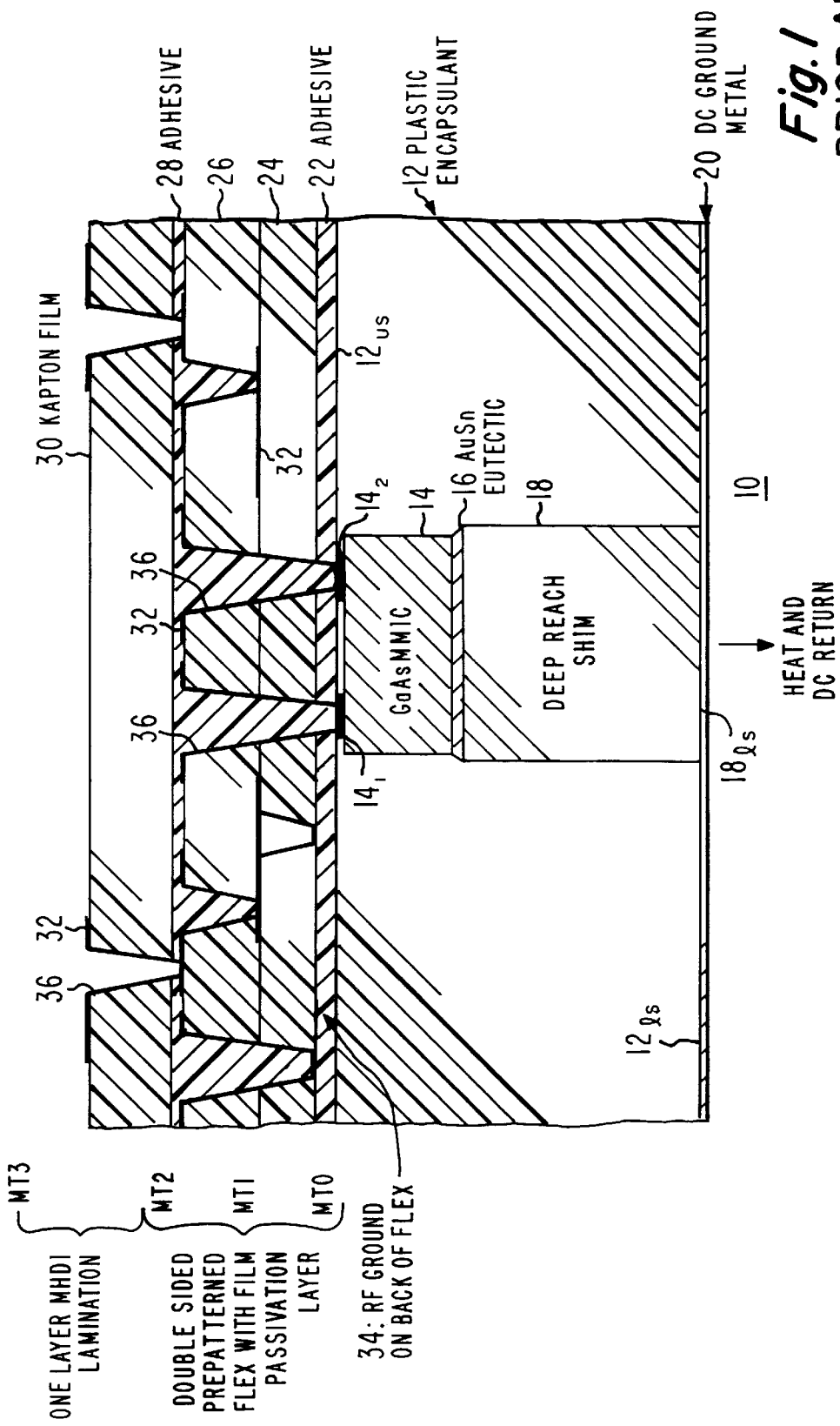
FIG. 1 is a simplified cross-sectional view of a portion of a prior-art high-density interconnect arrangement by which connections are made between multiple integrated-circuit chips mounted on a single supporting substrate.
Figure 2A:
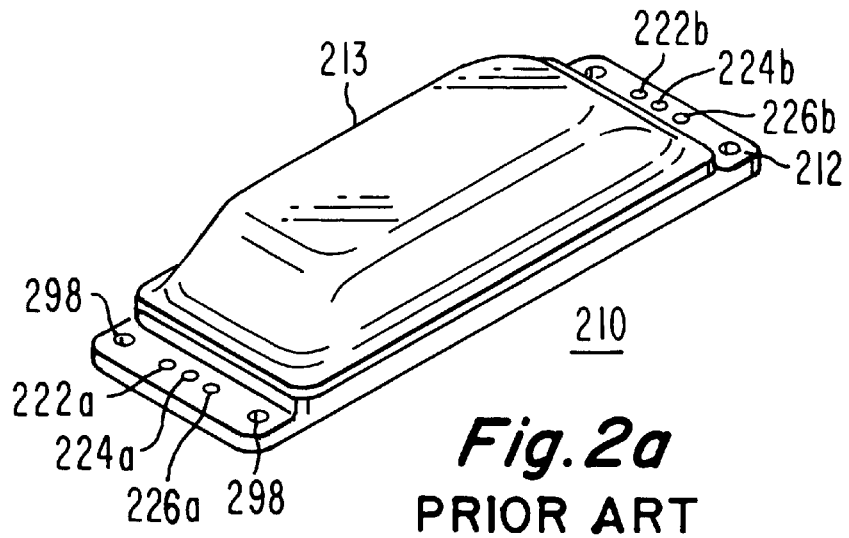
FIG. 2a is a simplified perspective or isometric view of a prior-art module which contains HDI-connected integrated-circuit chips.
Figure 2B:
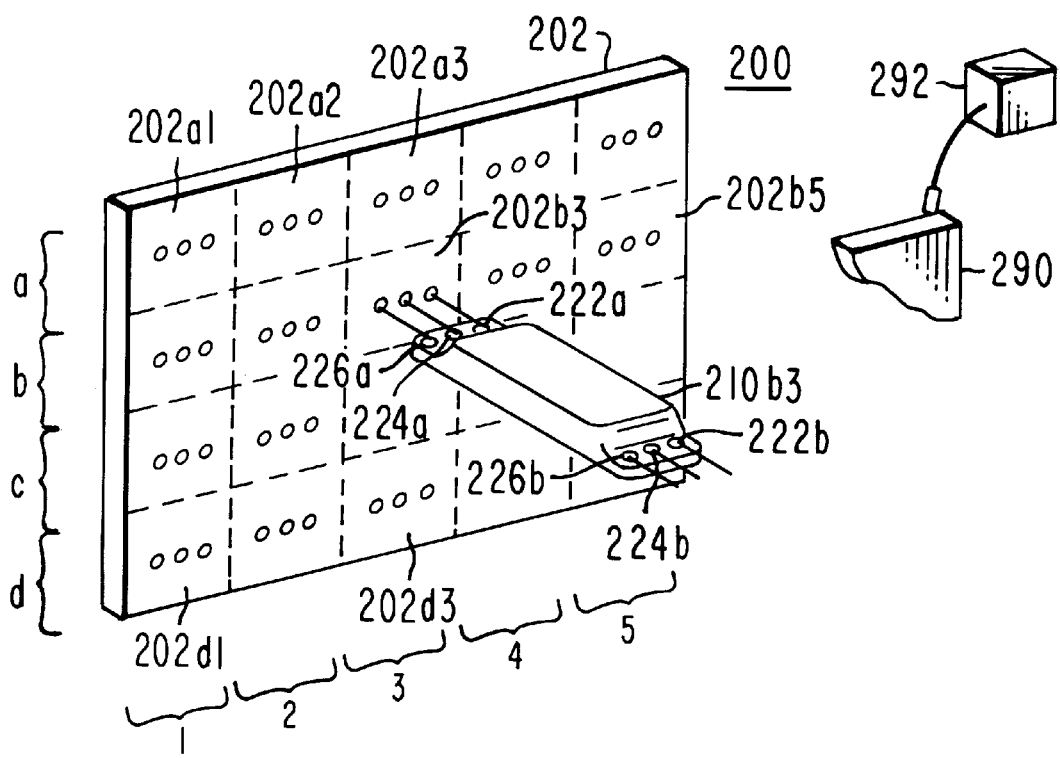
FIG. 2b illustrates how a flat or planar antenna array might use a plurality of the modules of FIG. 2a to form an active antenna array.

In FIGS. 3a 3b, and 3c, a short transmission line or "molded coaxial interconnect" 310 is in the form of a flat disk or right circular cylinder 311 having a thickness 312 and an outer diameter 314 centered about an axis 308. Thickness 312 should not exceed diameter 314. An electrically conductive center conductor 316 is in the form of a right circular cylinder defining a central axis which is concentric with axis 308. A set 318 of a plurality, in this case eight, of further electrical conductors 318a, 318b, 318c, 318d, 318e, 318f, 318g, and 318h, are also in the form of right circular cylinders, with axes which lie parallel with the axis 308 of the flat disk. The further electrical conductors have their axes equally spaced by an incremental angle of 45° on a circle of diameter 320, also centered on axis 308. The main body of short transmission line 310 is made from a dielectric material, which encapsulates the sides, but not the ends, of center conductor 316 and outer conductors 318a, 318b, 318c, 318d, 318e, 318f, 318g, and 318h. The diameter of circle 320 on which the axes of the outer conductors lie is selected so that the outer conductors lie completely within the outer periphery of the dielectric disk. A first end of the center conductor and the outer conductors lies adjacent a plane 301, and a second end of each lies adjacent to a second plane 302. In a particular embodiment of the short transmission line, the thickness 312 is 0.055 in., and the diameter is 0.304 in. In another embodiment, the diameter is the same, but the thickness is 0.115 in. In both embodiments, the axes of the outer conductors of set 308 are centered on a circle of diameter 0.192 in., and the conductors have diameters of 0.032 in. The material of the dielectric disk is Plaskon SMT-B-1 molding compound, and the conductors are copper. As described below, these short transmission lines are used for interconnecting RF circuits. The characteristic impedance of the short transmission line of FIGS. 3a, 3b, and 3c is selected to substantially match the impedances of the signal source and sink, or to substantially match the impedances of the stripline or microstrip transmission lines to which the short transmission line is connected in an HDI circuit. The impedance $Z_0$ of the short transmission line is determined by $$Z_0 = \left(\frac{138}{\sqrt{\varepsilon}}\right) \log_{10}\left(\frac{D_0}{D_i}\right) \quad 1$$

where $\varepsilon$ is the dielectric constant of the dielectric disk;

$D_0$ is the diameter of the inside surface of the outer conductor; and $D_i$ is the outer diameter of the center conductor. To produce a 50-ohm characteristic impedance, with center conductor wire diameter of 0.032" and epoxy encapsulation material having a dielectric constant of 3.7, the axes of the outer conductors should be on a circle having a diameter of 0.192 inches.

Figure 4A:
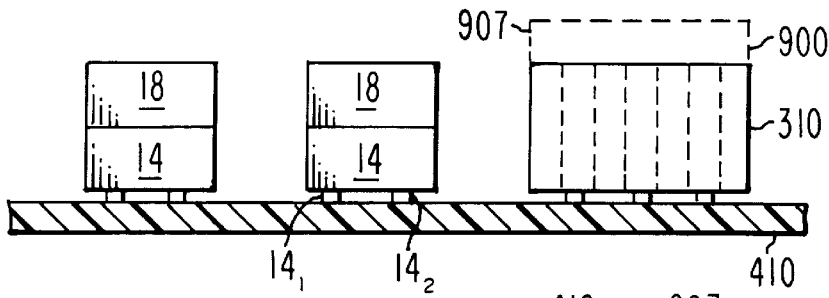
FIGS. 4a, 4b, 4c, 4d, 4e, 4f, 4g, and 4h illustrate steps, in simplified form, in the fabrication of an RF HDI structures using a short transmission-line as in FIGS. 3a, 3b, and 3c to interface to another planar circuit, illustrated as a beamformer or manifold.
Figure 4B:
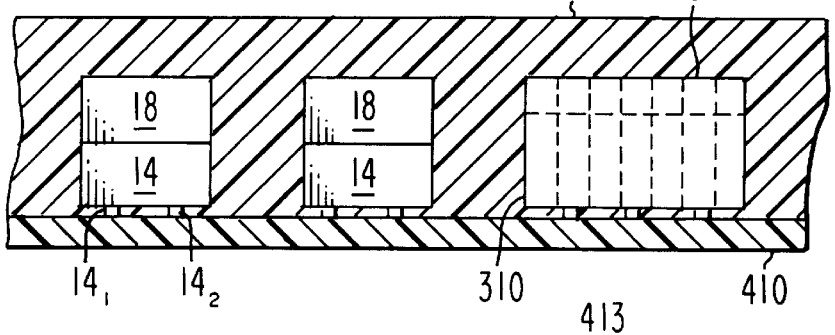
Figure 4C:
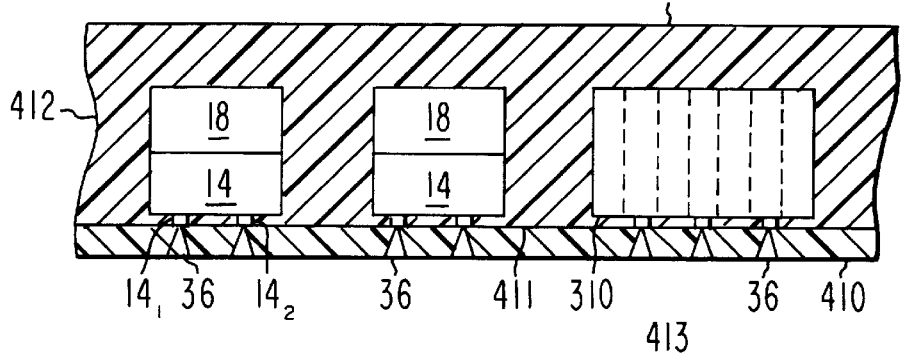
Figure 4D:
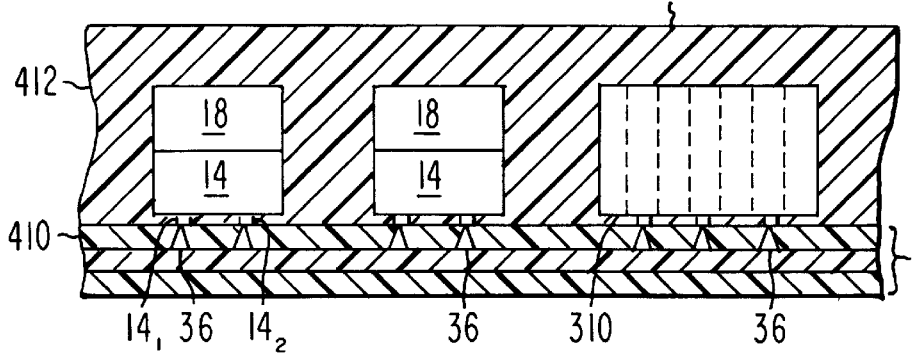

FIGS. 4a, 4b, 4c, 4d, 4e, 4f, and 4h illustrate steps in the fabrication of an RF HDI structure. In a step preceding that illustrated in FIG. 4a, one or more short transmission lines 310 are fabricated, and monolithic RF circuits 14 are assembled with heat-transferring metal deep-reach shims 18. In FIG. 4a, the chip/shim assemblages 14/18 and the short transmission lines 310 are mounted face-down onto an adhesive backed KAPTON substrate 410. FIG. 4b illustrates the encapsulation of the assemblages 14/18 and the short transmission line 310 within an epoxy or other encapsulation to form a structure with encapsulated chips and transmission-lines. The structure of FIG. 4b with encapsulated chips and transmission lines then continues through conventional HDI processing. As illustrated in FIG. 4c, vias are laser-drilled to die bond pads $14_1$ and $14_2$ and to the conductors of the short transmission line 310 which are against the substrate 410. Conductive traces are then patterned on the exposed substrate 410, making the necessary electrical connections. FIG. 4d illustrates the result of applying a plurality (illustrated as three) of layers of conductive-trace bearing flexible HDI connection material designated together as 424, with the traces appropriately registered with the connections $14_1$ and $14_2$ of the chips 14, and with the center conductor 316 and the set 318 of outer conductors of the short transmission line 310.

Figure 4F:
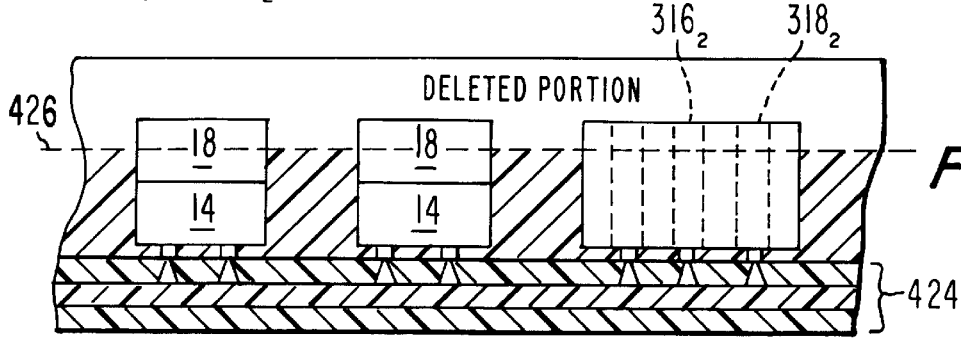
Figure 4E:
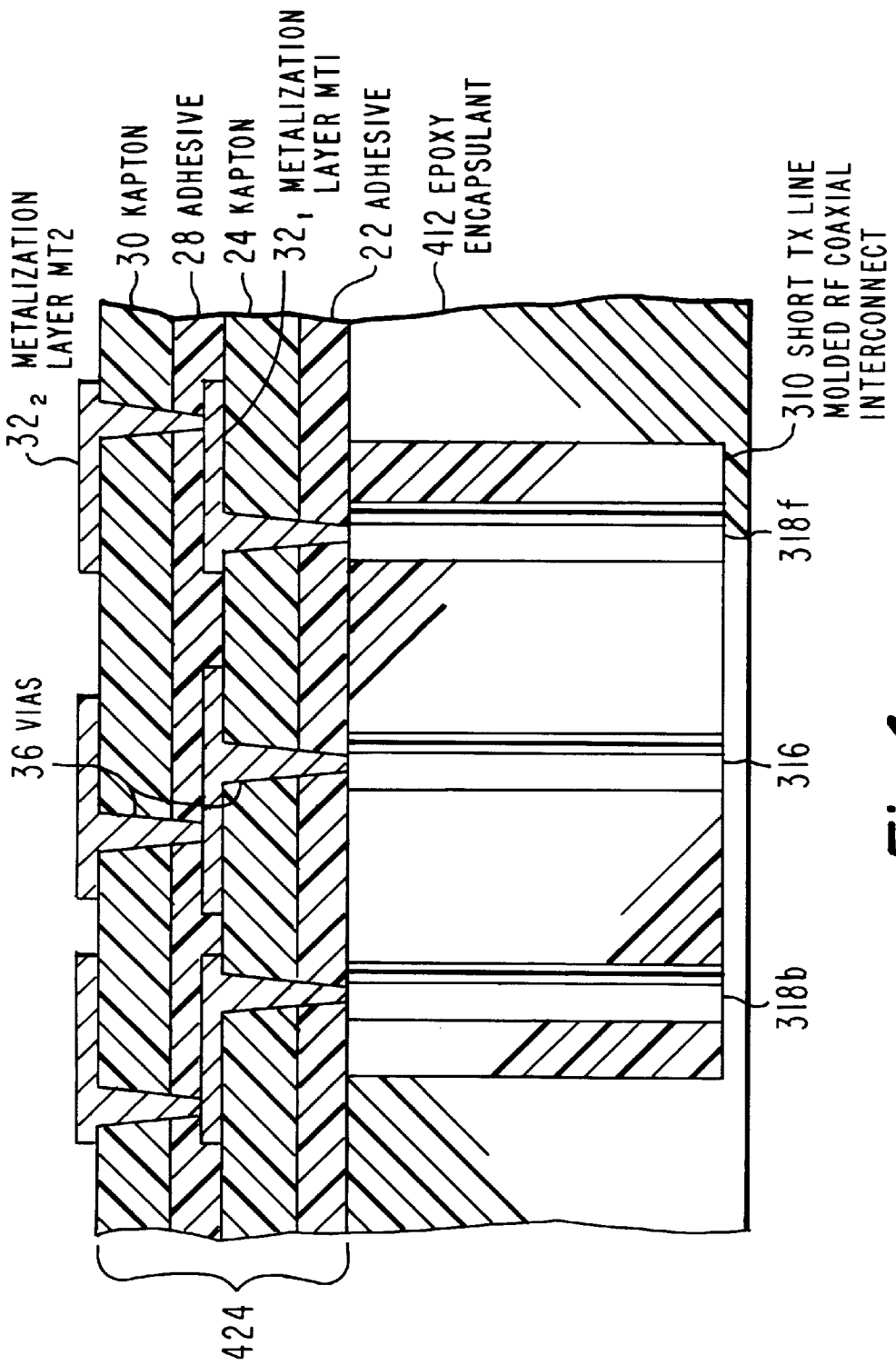

Following the step illustrated in FIG. 4c, plated through-vias 36 are formed in the conductive-trace bearing flexible HDI connection material 424, with the result that the chip connections are made, and the connections to the short transmission line 18 are made as illustrated in FIG. 4e. The metallization layers 32 connect the short transmission line to at least one of the chips 14, so that one connection of a chip connects to center conductor 316 of short transmission line 310 of FIG. 4e, and so that a ground conductor associated with the chip connects to the set 318 of outer conductors of the short transmission line. FIG. 4f represents the cutting off of that portion of the encapsulated structure (the structure of FIG. 4e) which lies, in FIG. 4f, above a dash line 426. This produces a planar structure 401, illustrated in FIG. 4g, in which the connections among the chips 14, and between the chips and one end of the short transmission lines, lie within the conductive-trace layers 424 on the "bottom" of the encapsulated structure, and in which a heat interface end $18_{hi}$ of each of the heat-conducting shims 18, and the ends of the center conductor 316 and of the set 318 of outer conductors of a coaxial connection structure 490 at the end of the short transmission line, are exposed on the "upper" side of the structure as contacts. The center conductor contact is illustrated as $316_c$, and some of the outer conductor contacts are designated as $318a_c$ and $318f_c$.

Figure 4G:
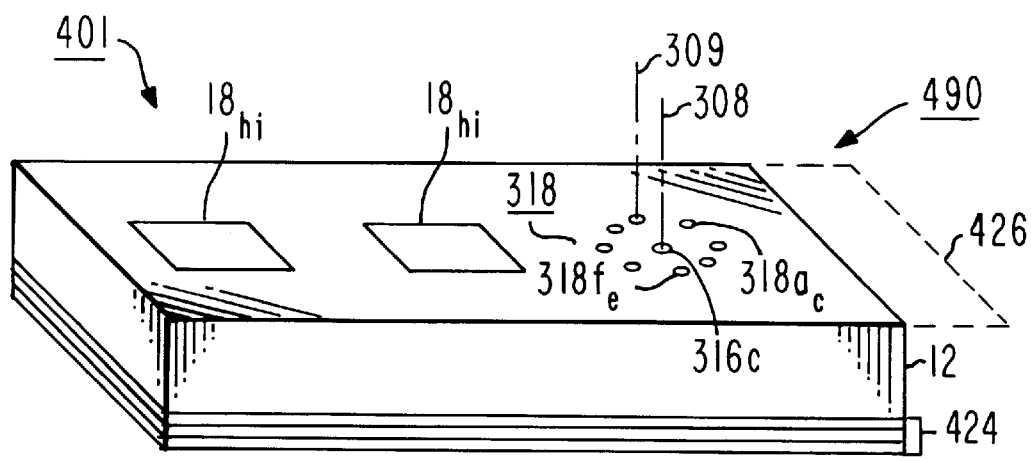
Figure 4H:
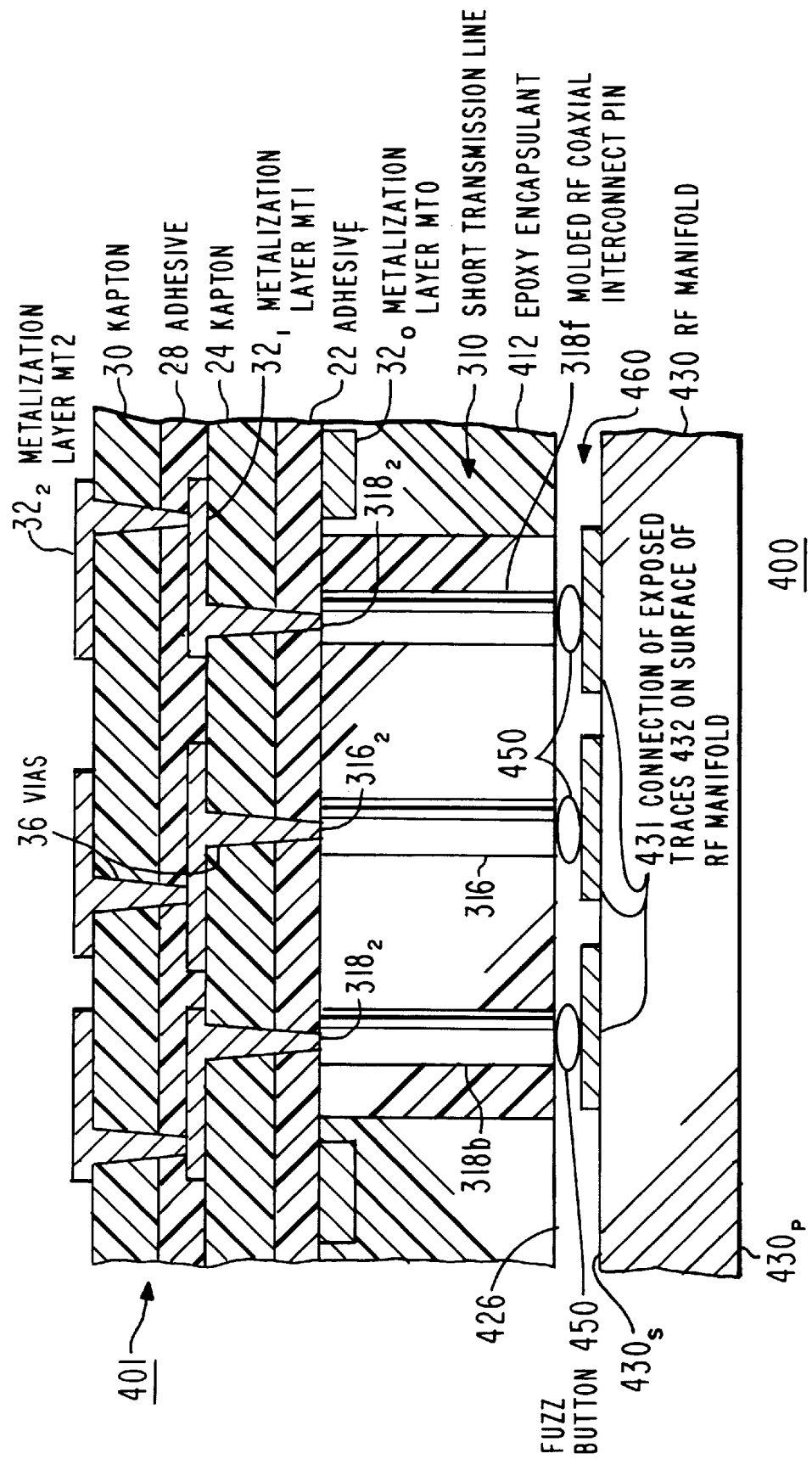

FIG. 4h illustrates a cross-section of a structure resulting from a further step following the step illustrated in conjunction with FIGS. 4f and 4g. More particularly, the structure of FIG. 4g is attached to an RF manifold or beamformer 430, which distributes the signals which are to be radiated by the active array antenna. The surface 430s of manifold 430 which is adjacent to the encapsulated structure bears conductive traces, some of which are designated 432. In order to make contact between the conductive traces 432 on the RF distribution manifold and the exposed ends of the center conductor 316 and the set 318 of outer conductors of the short transmission line, compressible electrical conductors 450, termed "fuzz buttons," are placed between the conductive traces 432 on the distribution manifold 430 and the exposed ends of the center conductor 316 and set 318 of outer conductors of each of the short transmission lines 310. The manifold 430 is then pressed against the remainder of the structure, with the fuzz buttons between, which compresses the fuzz buttons to make good electrical connection to the adjacent surfaces, and which also tends to hold the fuzz buttons in place due to compression. Appropriate thermal connection must also be made between the manifold and the shims 18 to aid in carrying away heat. Thus, in the arrangement of FIGS. 4a–4h, electrical RF signals are distributed to the ports (only one illustrated) of the distribution manifold 430 to a plurality of the ports (only one of which is illustrated) represented by short transmission lines 310 of planar circuit 401 of FIG. 4g, and the signals are coupled through the short transmission lines to appropriate ones of the metallization layers $32_0$, $32_1$, and $32_2$, as may be required to carry the signals to the MMIC for amplification or other processing, and the signals processed by the MMIC are then passed through the signal paths defined by the paths defined by conductive traces $32_0$, $32_1$, and $32_2$ to that layer of conductive traces which is most remote from the distribution manifold 430. More particularly, when the distribution manifold 430 is in the illustrated position relative to the encapsulated pieces, the uppermost layer $32_2$ of conductive traces may itself define the antenna elements. Thus, the structure 400 defined in FIG. 4h, together with other portions which appear in other ones of FIGS. 4a–4g, comprises the distribution, signal processing, and radiating portions of a planar or flat active array antenna.

The fuzz buttons 450 of FIG. 4h may be part no. 3300050, manufactured by TECKNIT, whose address is 129 Dermody Street, Cranford, N.J. 07016, phone (908) 272-5500.

If the conductors $32_2$ of metallization layer MT2 of FIG. 4h are elemental antenna elements, the RF manifold 430 can be a feed distribution arrangement which establishes some measure of control over the distribution of signals to the active MMICs of the various antenna elements. On the other hand, the structure of FIG. 4h denominated as RF manifold 430 could instead be an antenna array, with the elemental antennas on side 430p, while the metallization layers $32_1$ and $32_2$ would in that case distribute the signals to be radiated, or collect the received signals. Thus, the described structure is simply a connection arrangement between two separated planar distribution sets.

It will be noted that in FIG. 4h, the region 460 about the fuzz buttons 450 is surrounded by air dielectric, which has a dielectric constant of approximately 1. Since the fuzz buttons 450 have roughly the same diameter as the center conductor 316 and the outer conductors 318, the characteristic impedance of the section 460 of transmission line extending from exposed traces 432 to short transmission line 310 is larger than that of the short transmission line. If the short transmission line has a characteristic impedance of about 50 ohms, the characteristic impedance of the region 460 will be greater than 50 ohms. Those skilled in the art know that such a change of impedance has the effect of interposing an effective inductance into the transmission path, and may be undesirable.

Figure 5:
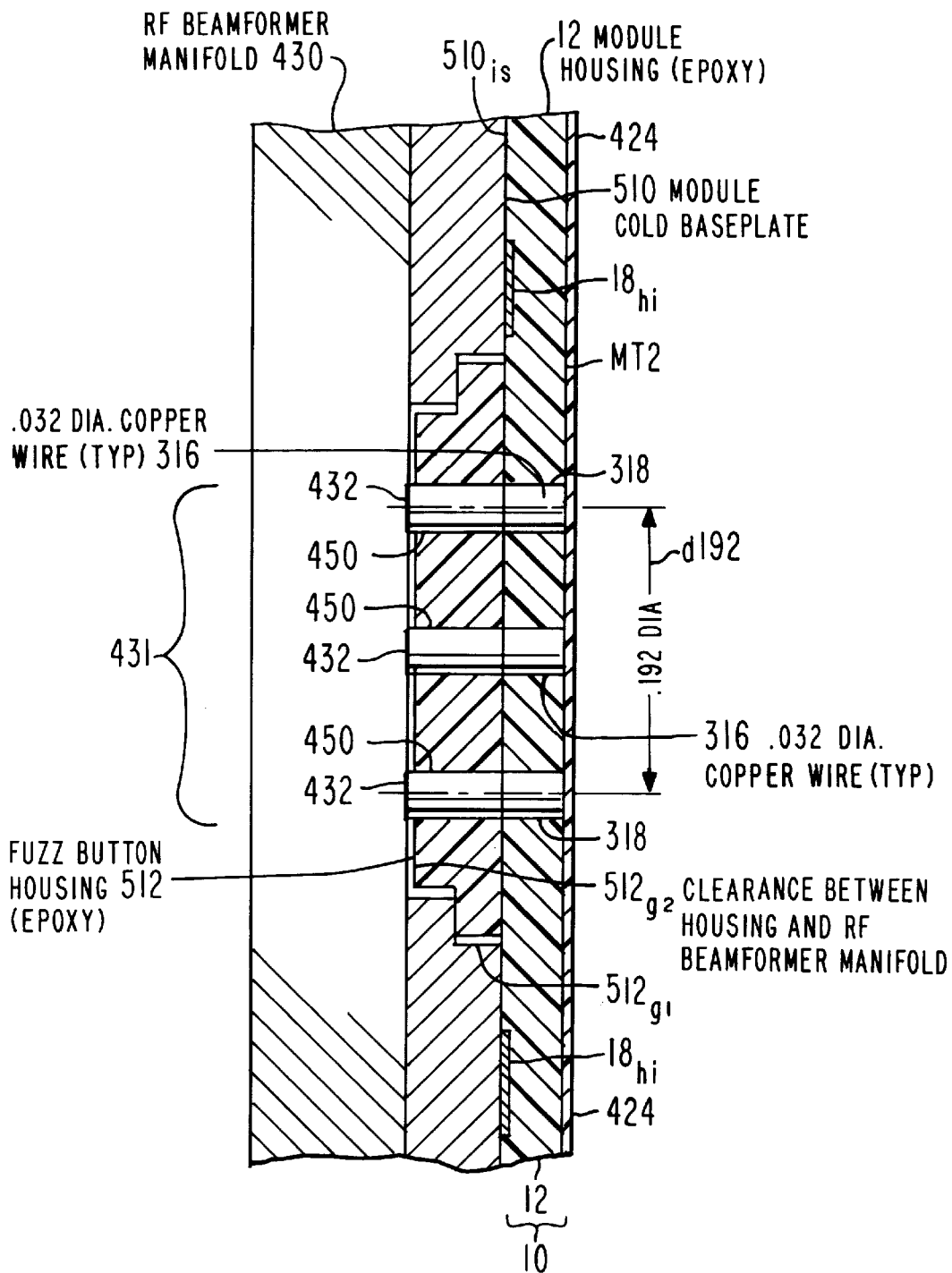
FIG. 5 illustrates an arrangement similar to that of FIG. 4h with a cold plate interposed between the HDI-connected chips and the beamformer, and using a rigid fuzz button holder.

FIG. 5 represents a structure such as that of FIG. 4h with a cold plate 510 interposed between the HDI-connected chips 10 on structure 12 and the beamformer 430. The cold plate 510 has an interface surface 510is which makes contact with the adjacent surface of the plastic body 12 of the HDI circuit 10. The cold plate may be, as known in the art, a metal plate with fluid coolant channels or tubes located within, for carrying heat from heat interface surfaces $18_{hi}$ to a heat rejection location (not illustrated). Those skilled in the art know that a heat conductive grease or other material may be required at the interface. As illustrated in FIG. 5, a fuzz button housing 512 has a thickness about equal to that of the cold plate, for holding fuzz buttons 450 in a coaxial pattern similar to that of center conductor 316 and outer conductors 318, for making connections between the center conductor 316/outer conductors 318 and the corresponding metallizations 432 of the beamformer 430. More particularly, the outer conductors 318 and the outer conductor fuzz buttons 450 lie on a circle with diameter d192. The dielectric constant of the material of fuzz button housing 512 is selected to provide the selected characteristic impedance. As also illustrated in FIG. 5, fuzz button housing 512 is not quite as large in diameter as the cut-out or aperture in cold plate 510, in order to take tolerance build-up. Consequently, an air-dielectric gap $512_{g1}$ exists around fuzz button housing 512. The axial length of fuzz button housing 512 is similarly not quite as great as the thickness of the cold plate 510, resulting in a gap $512_{g2}$. Gaps $512_{g1}$ and $512_{g2}$ have an effect on the characteristic impedance of the transmission path provided by the fuzz buttons 450 which is similar to the effect of the air gap 460 of FIG. 4h. In an analysis of an arrangement similar to that of FIG. 5, the calculated through loss was 0.8 dB, and the return loss was only 10.5 dB.

The fuzz button housing or holder 512 is made from an elastomeric material, which compresses when compressed between the HDI-connected chips 10 and the underlying beamformer 430, so as to eliminate air gaps which might adversely affect the transmission path. FIGS. 6a, 6b, and 6c are views of a compressible or compliant RF interconnect with fuzz button conductors. In FIGS. 6a, 6b, and 6c, elements corresponding to those of FIGS. 3a, 3b, and 3c are designated by like reference numerals, but in the 600 series rather than in the 300 series. As illustrated in FIGS. 6a, 6b, and 6c, compliant RF interconnect 610 includes a fuzz button center conductor 616 defining an axis 608, and a set 618 including a plurality, illustrated as eight, of fuzz button outer conductors 618a, 618b, 618c, 618d, 618e, 618f, 618g, and 618$h$, spaced at equal angular increments, which in the case of eight outer conductor elements corresponds to 45°, about center axis 608, on a radius 620 having a diameter of 0.200". Dielectric body 611 has an outer periphery 611$p$, and is made from a silicone elastomer having a dielectric constant within the range of 2.7 to 2.9, and has an overall diameter 614 of about 0.36", and a thickness 612 of 0.10". As can be best seen in FIGS. 6$a$ and 6$c$, the dielectric body 611 has two keying notches 650$a$ and 650$b$. Dielectric body 611 also has a flanged inner portion 648 with a diameter of 0.30", and the maximum-diameter portion 652 has a thickness 654 of about 0.44". The fuzz buttons 616, 618 have a length 613 in the axial direction which is slightly greater (0.115" in the embodiment) than the axial dimension 612 of body 611 (0.10"). FIG. 6$d$ illustrates a representative one of the outer conductor fuzz buttons, which is selected to be fuzz button 618$f$ for definiteness. In FIG. 6$d$, outer conductor fuzz button 618$f$ is in the form of a right circular cylinder centered on an axis 617, and defines first and second ends 618$f_1$ and 618$f_2$ which are coincident with planes 601 and 602, respectively, of FIG. 6$b$. The cylindrical form of fuzz button 618$f$ of FIG. 6$d$ defines an outer surface 618$_{fs}$ lying between the first and second ends 618$f_1$ and 618$f_2$.

Figure 7:
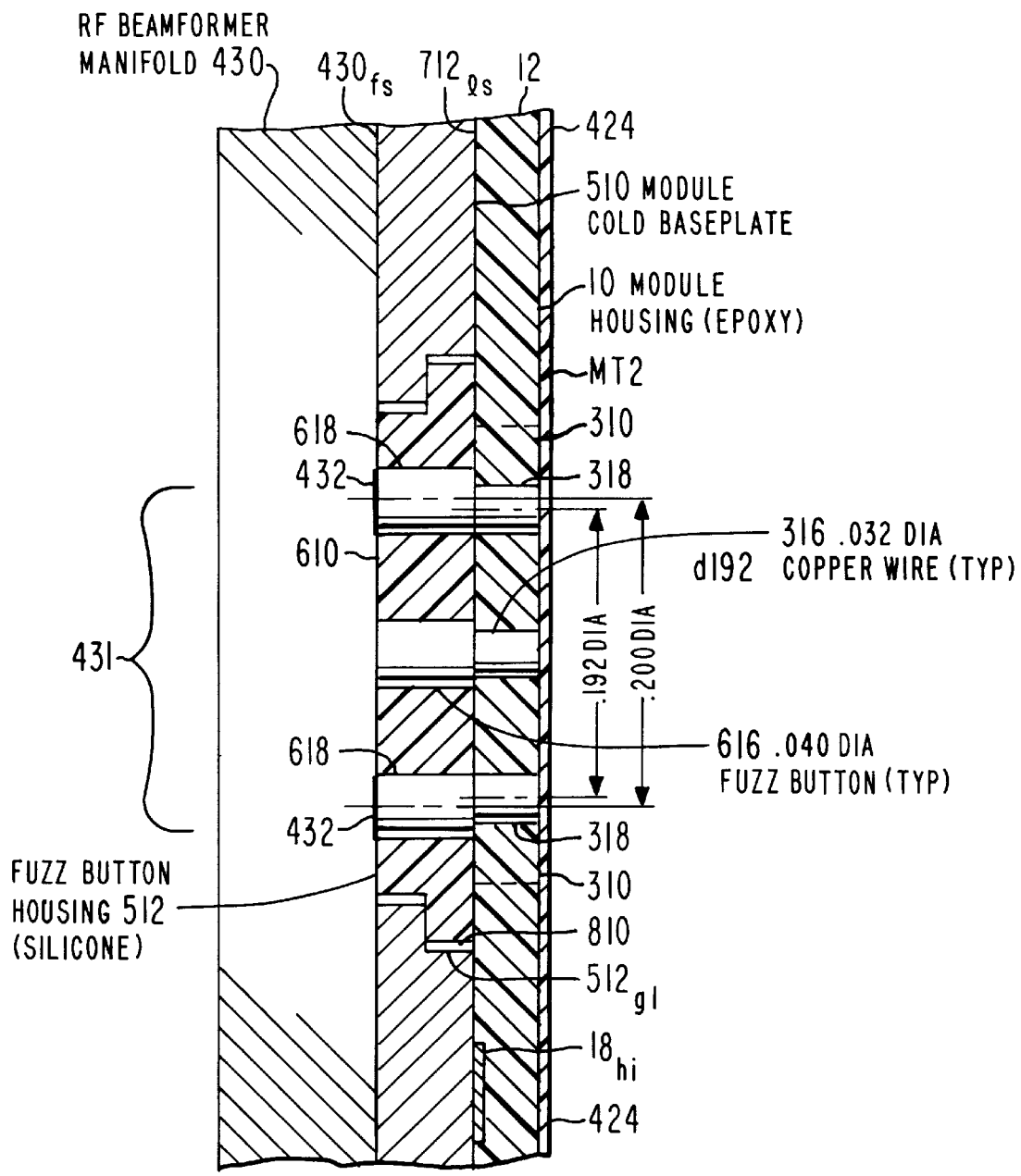
FIG. 7 is a simplified cross-sectional representation of an assemblage including a cold plate, in which a compressible fuzz button holder is used.
Figure 8:
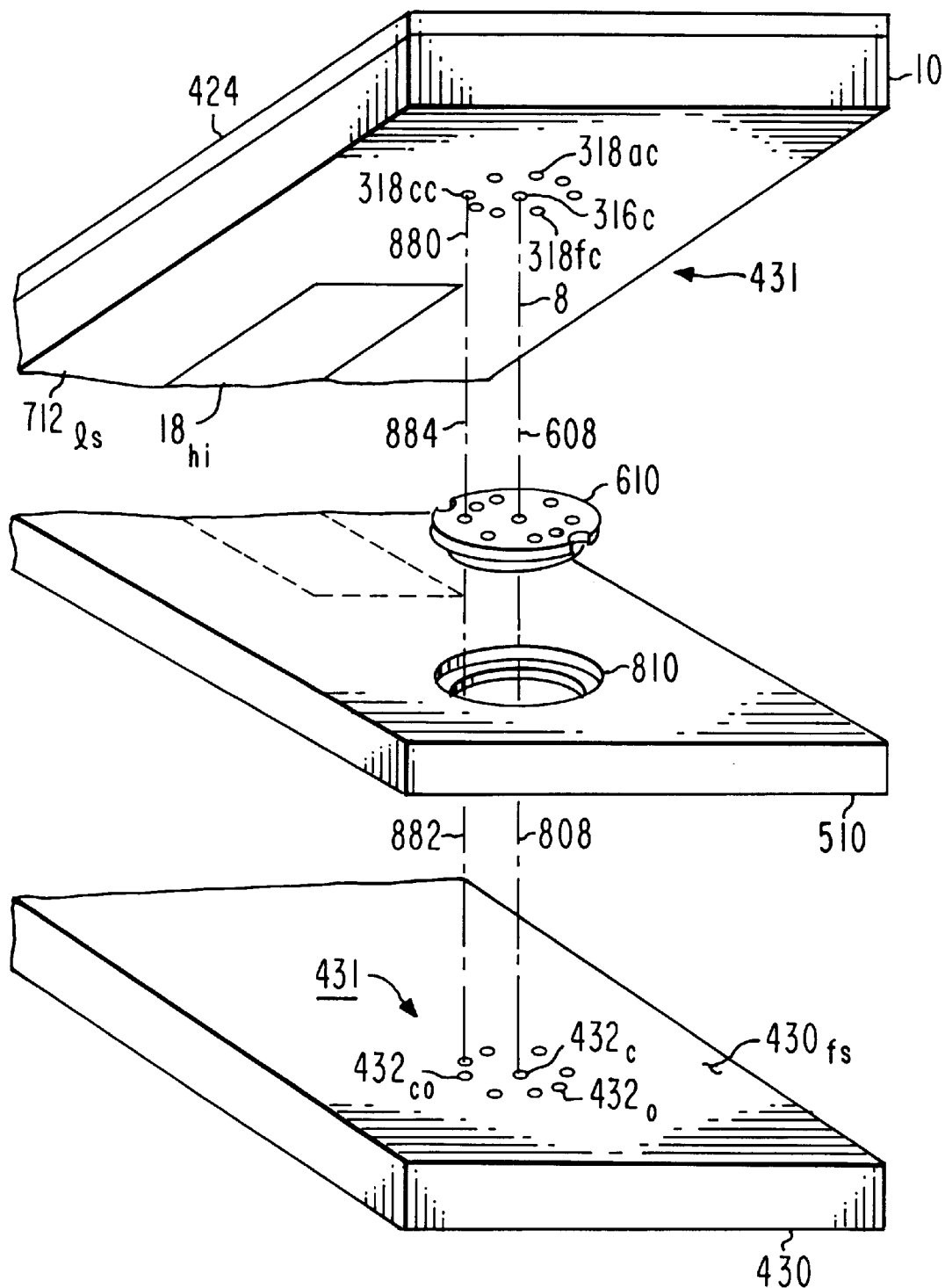
FIG. 8 is a simplified perspective or isometric view, exploded to reveal certain details, of the assemblage of FIG. 7.

FIG. 7 is similar to FIG. 5, and corresponding elements are designated by the same reference numerals. In FIG. 7, the compliant RF interconnect 610 is compressed between the broad surface 430$_{fs}$ of beamformer manifold 430 and the broad surface 712$_{ls}$ of HDI-connected chip arrangement 10, and is somewhat compressed axially, to thereby eliminate the gap 512$_{g2}$ which appears in FIG. 5. This, in turn, eliminates the principal portion of the impedance discontinuity at the interface which is filled by the compliant RF interconnect 610. The axial compression of the dielectric body 611 of the compliant RF interconnect 610, in turn, tends to cause the compliant body 611 to expand radially, to thereby somewhat fill the circumferential or annular gap 512$_{g1}$, which further tends to reduce impedance discontinuities at the interface. A further advantage of the axial compression of body 611 is that the compression tends to compress the body 611 around the fuzz button conductors 616, 618, to help in holding them in place. Analysis of the arrangement of FIG. 7 indicated that the through loss would be 0.3 dB and the return loss 28 dB, which is much better than the values of 0.8 dB and 10.5 dB calculated for the arrangement of FIG. 5.

As illustrated in FIG. 7, a heat-transfer interface surface 18$_{hi}$ on the broad surface 712$_{ls}$ of HDI-connected chip structure 10 is pressed against cold plate 510.

In the view of FIG. 7, the fuzz button conductors 616 and 618 of the compliant coaxial interconnect 610 are illustrated as being of a different diameter than the conductors 316, 318 of the molded coaxial interconnect 310, and the outer conductors 618 are centered on a circle of somewhat different diameter than the outer conductors 318. The difference in diameter of the wires and the spacing of the outer conductor from the axis of the center conductor is attributable to differences in the dielectric constant of the epoxy which is used as the dielectric material in the molded coaxial interconnect 310 and the silicone material which is the dielectric material of compliant interconnect 610. In order to minimize reflection losses, both interconnects are maintained near 50 ohms, which requires slightly different dimensioning. This should not be a problem, so long as the diameters of the circles on which the outer conductors of the molded and compliant interconnects are centered allow an overlap of the conductive material, so that contact is made at the interface.

A method for making electrical connections as described in conjunction with FIGS. 6$a$, 6$b$, 6$c$, 7, and 8 includes the step of providing or procuring a first planar circuit 10 including at least a first broad surface 712$_{ls}$. The first broad surface 712$_{ls}$ of the first planar circuit 10 includes at least one region 490 defining a first coaxial connection. It may also include at least a first thermally conductive region 18$_{hi}$ to which heat flows from an active device within the first planar circuit. The first coaxial connection 490 of the first planar circuit 10 defines a center conductor contact 616$_c$ centered on a first axis 608 orthogonal to the first broad surface of the first planar circuit 10, and also defines a first plurality of outer conductor contacts, such as 618$a_c$ and 618$f_c$. Each of the outer conductor contacts such as 618$a_c$, 618$f_c$ of the first coaxial connection 490 of the first planar circuit 10 is centered and equally spaced on a circle spaced by a first particular radius, equal to half of diameter d192, from the first axis 608 of the center conductor contact 616 of the first coaxial connection 490. The first broad surface 712$_{ls}$ of the first planar circuit 10 further includes dielectric material electrically isolating the center conductor contact 616$c$ of the first planar circuit 10 from the outer conductor contacts, such as 618$a_c$, 618$f_c$, and the outer conductor contacts, such as 618$a_c$, 618$f_c$, from each other. The method also includes the step of providing a second planar circuit 430, which includes at least a first broad surface 430$_{fs}$. The first broad surface 430$_{fs}$ of the second planar circuit 430 includes at least one region 431 defining a coaxial connection. The coaxial connection 431 of the second planar circuit 430 includes a center conductor contact 432$_c$ centered on a second axis 808 orthogonal to the first broad surface 430$_{fs}$ of the second planar circuit 430, and also includes the first plurality (eight) of outer conductor contacts 432$_o$. Each of the outer conductor contacts, such as 432$_{co}$, 432$_o$, of the coaxial connection 431 of the second planar circuit 430 is centered and equally spaced on a circle spaced by a second particular radius, close in value to the first particular radius, from second axis 808 of the center conductor contact 432$_c$ of the coaxial connector 431 of the second planar circuit 430. The first broad surface 430$_{fs}$ of the second planar circuit 430 further includes dielectric material electrically isolating the center conductor contact 432$_c$ of the second planar circuit 430 from the outer conductor contacts, such as 432$_{co}$, 432$_o$ of the second planar circuit 430, and the outer conductor contacts, such as 432$_{co}$, 432$_o$ of the second planar circuit 430, from each other. A compliant coaxial connector 610 is provided, which includes (a) a center conductor 616 which is electrically conductive and physically compliant, at least in the axial direction. The compliant center conductor 616 has the form of a circular cylinder centered about a third axis 608, and defines an axial length 613 between first 617$_{f1}$ and second 617$_{f2}$ ends. The compliant coaxial connector 610 also includes (b) an outer electrical conductor arrangement 618 including a set 618 including the first plurality (eight) of mutually identical, electrically conductive, physically compliant outer conductors 618$a$, 618$b$, 618$c$, 618$d$, 618$e$, 618$f$, 618$g$, and 618$h$. Each of the compliant outer conductors 618$a$, 618$b$, 618$c$, 618$d$, 618$e$, 618$f$, 618$g$, and 618$h$ is in the form of a circular cylinder centered about an axis 617, and each has an axial length 613 between first 617$_{f1}$ and second 617$_{f2}$ ends which is equal to the axial length 613 of the compliant center conductor 616. The axes 617 of the compliant outer conductors 618$a$, 618$b$, 618$c$, 618$d$, 618$e$, 618$f$, 618$g$, and 618$h$ are oriented parallel with each other, and with the third axis 608 of the compliant center conductor 616. The first ends 617$_{f1}$ of the compliant center conductor 616 and the compliant outer conductors 618$a$, 618$b$, 618$c$, 618$d$, 618$e$, 618$f$, 618$g$, and 618$h$ coincide with a first plane 601 which is orthogonal to the axes 608, 617 of the compliant center conductor 616 and the compliant outer conductors 618$a$, 618$b$, 618$c$, 618$d$, 618$e$, 618$f$, 618$g$, and 618$h$, and the second ends 617$_{f2}$ of the compliant center conductor 616 and the compliant outer conductors 618$a$, 618$b$, 618$c$, 618$d$, 618$e$, 618$f$, 618$g$, and 618$h$ coincide with a second plane 602 parallel with the first plane 601. The compliant outer conductors 618$a$, 618$b$, 618$c$, 618$d$, 618$e$, 618$f$, 618$g$, and 618$h$ have their axes 617 equally spaced from each other at the particular radius from the axis 608 of the compliant center conductor 616. The compliant coaxial connector 610 further includes (c) a compliant dielectric disk-like structure 611 defining a fourth center axis 608 coincident with the third axis 608 of the compliant center conductor 616 and also defining an uncompressed axial length no more than about 10% greater than the uncompressed axial length of the compliant center conductor 616. The compliant disk-like structure 611 also defines a periphery 611$p$ spaced from the center axis 608 by a second radius which is greater than both (a) the first radius (half of diameter 620) and (b) the axial length 613 of the compliant center conductor 616. The compliant dielectric disk 611 surrounds and supports the compliant center conductor 616 and the compliant outer conductors 618$a$, 618$b$, 618$c$, 618$d$, 618$e$, 618$f$, 618$g$, and 618$h$ at least on side regions 618$_{fs}$ thereof lying between the first 618$_{f1}$ and second 618$_{f2}$ ends of the compliant center conductor 616 and the compliant outer conductors 618$a$, 618$b$, 618$c$, 618$d$, 618$e$, 618$f$, 618$g$, and 618$h$. The compliant dielectric disk-like structure 611 does not overlie the first 618$_{f1}$ ends of the compliant center conductor 616 and the compliant outer conductors 618$a$, 618$b$, 618$c$, 618$d$, 618$e$, 618$f$, 618$g$, and 618$h$, so that electrical connection thereto can be easily established.

The method described in conjunction with FIGS. 6$a$, 6$b$, 6$c$, 7, and 8 also includes the further step of placing the first broad surfaces 712$_{ls}$, 430$_{fs}$ of the first and second planar circuits 10, 430 mutually parallel, with the first axis 8 passing through the center of the center conductor contact 316$c$ of the first planar circuit 10 and orthogonal to the first broad surface 712$_{ls}$ of the first planar circuit 10, and coaxial with the second axis 808 passing through the center of the center conductor contact 432$_c$ of the second planar circuit 430 orthogonal to the first broad surface 430$_{ls}$ of the second planar circuit 430, with the first and second planar circuits 10, 430 rotationally oriented around the coaxial first and second axes 8, 808 so that a fourth axis 880 orthogonal to the first broad side 712$_{ls}$ of the first planar circuit 10 and passing through the center of one of the outer conductor contacts 318$_{cc}$ of the first coaxial connector 431 of the first planar circuit 10 is coaxial with a fifth axis 882 orthogonal to the first broad side 430$_{fs}$ of the second planar circuit 430 and passing through the center of one of the outer conductor contacts 432$_{cc}$ of the first coaxial connector 431 of the second planar circuit 430. The compliant coaxial connector 310 is placed between the first and second planar circuits 10, 430, with the third axis 608 of the compliant center conductor 616 substantially coaxial with the mutually coaxial first and second axes 8, 808. The compliant coaxial connector 610 is oriented so that a sixth axis 884 of one of the compliant outer conductors 618$a$, 618$b$, 618$c$, 618$d$, 618$e$, 618$f$, 618$g$, and 618$h$ is coaxial with the mutually coaxial fourth and fifth axes 880, 882. Force is applied to translate the first and second planar circuits 10, 430 toward each other until the compliant coaxial connector 610 is compressed between the first broad surface 712$_{ls}$ of the first planar circuit 10 and the first broad surface 430$_{fs}$ of the second planar circuit 430 sufficiently to make contact between the center conductor contacts 316$_c$, 432$_c$ of the first and second planar circuits 10, 430 through the compliant center conductor 616, and to make contact between outer conductor contacts 318$a_c$, 318$f_c$ of the first planar circuit and corresponding outer conductor contacts 432$_{ac}$, 432$f_c$ of the second planar circuit 430 through some of the compliant outer conductors 618.

In a particular version of the method described in conjunction with FIGS. 6$a$, 6$b$, 6$c$, 7, and 8 also includes the further step of procuring a first planar circuit 10 in which the first broad surface 712$_{ls}$ includes a first thermally conductive region 18$_{hi}$ to which heat flows from an active device within the first planar circuit. In this version of the method, before the step of applying force to translate the first and second planar circuits 10, 430 toward each other, a planar spacer or cold plate 510 is interposed between the first broad surface 712$_{ls}$ of the first planar circuit 10 and the first broad surface 430$_{fs}$ of the second planar circuit 430. In this method, the step of interposing a planar cold plate 510 between the first broad surfaces 712$_{ls}$, 430$_{fs}$ comprises the step of interposing a planar cold plate 510 having an aperture 810 with internal dimensions no smaller than twice the second radius of the compliant dielectric disk-like structure 610, with the outer periphery of the aperture 810 surrounding the compliant coaxial connector 610.

FIG. 9$a$ is a simplified perspective or isometric view of a short monolithic (one-piece without joints) conductive short-circuited transmission line or RF interconnect 900 according to an aspect of the invention, FIG. 9$b$ is a side or elevation view of the transmission line of FIG. 9$a$, and FIGS. 9$c$ and 9$d$ illustrate the arrangement of FIG. 9$a$ in encapsulated form. In FIGS. 9$a$ and 9$b$, the short-circuited transmission line or RF interconnect 900 has an air dielectric, and is made by machining from a block, or preferably by casting. Transmission line 900 includes a center conductor 916 centered on an axis 908, and having a circular cross-section. Center conductor 916 ends at a plane 903 in a flat circular end 916$e$, and each of the outer conductors 918$a$, 918$b$, 918$c$, 918$d$, 918$e$, 918$f$, and 918$h$ also has a corresponding flat circular end 918$ae$, 918$be$, 918$ce$, 918$de$, 918$ee$, 918$fe$, and 918$he$. The cross-sectional diameters of the center conductor 916 and the outer conductors 918$a$, 918$b$, 918$c$, 918$d$, 918$e$, 918$f$, and 918$h$ taper from a relatively small diameter $d_1$ of the circular ends at plane 903 to a larger diameter $d_2$ at a second plane 902. At (or immediately adjacent to) plane 902, a short-circuiting plate 907 interconnects the ends of the center conductor 916 and the outer conductors 918$a$, 918$b$, 918$c$, 918$d$, 918$e$, 918$f$, and 918$h$ which are remote from plane 903. In FIGS. 9$a$ and 9$b$, the axes of outer conductors 918$a$, 918$b$, 918$c$, 918$d$, 918$e$, 918$f$, and 918$h$, only one of which is illustrated and designated 918$aa$, lie on a circle illustrated as a dash line 921, which lies at a radius 920 from axis 908 of center conductor 916. The periphery lip of short-circuiting plate 907 is illustrated as being circular, with a diameter or radius measured from axis 908 which is just large enough so that the outer edges of the various outer conductors of set 918 are coincident or tangent with periphery lip at plane 902.

While not the best mode of using the short-circuited transmission line of FIGS. 9$a$ and 9$b$, FIGS. 9$c$ and 9$d$ illustrate the short-circuited transmission line 900 of FIGS. 9$a$ and 9$b$ encapsulated in a cylindrical body 911 of dielectric material corresponding to the dielectric body 311 of FIG. 3, to form an encapsulated short-circuited transmission line 901. As illustrated in FIG. 9$c$, the encapsulating body 911 does not cover the ends 916$e$ and 918$ae$, 918$be$, 918$ce$, 918de, 918ee, 918fe, and 918he of the center and outer conductors, thereby making them available for connections. As also illustrated in FIG. 9c, the diameter of dielectric body 911 of encapsulated short-circuited transmission line 901 is the same as the diameter 914 of the short-circuiting plate 907, so the side of the short-circuiting plate 907 is exposed. The diameter of the dielectric encapsulating body could be greater than diameter 914 of the short-circuiting plate 907, in which case the plate 907 would not be visible in FIG. 9c.

Figure 9A:
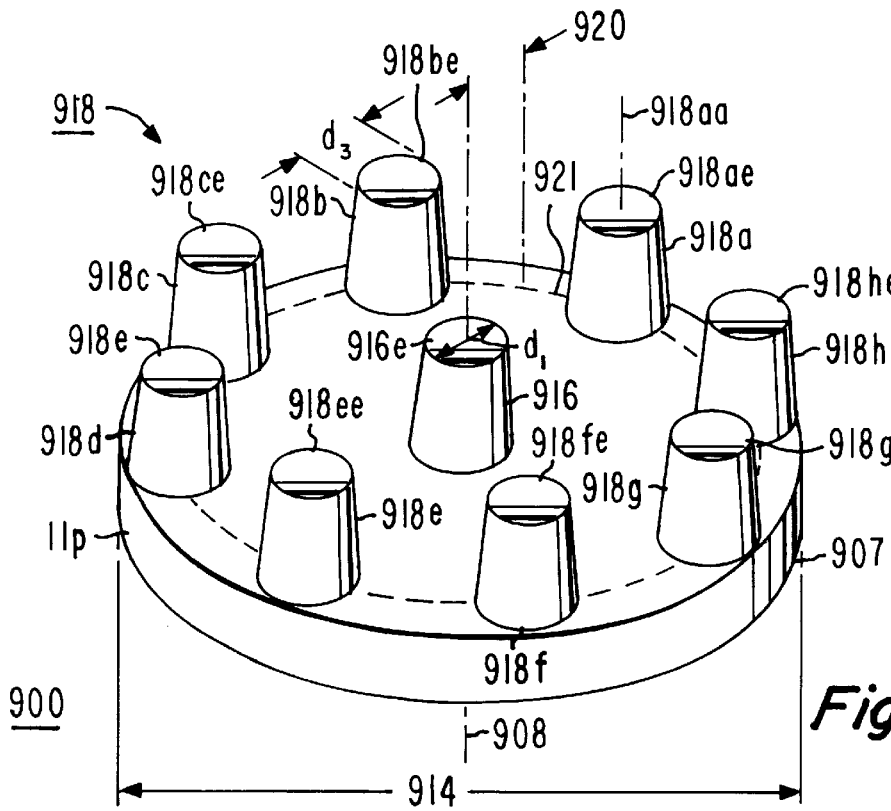
FIG. 9a is a simplified perspective or isometric view of a short-circuited transmission line according to an aspect of the invention.
Figure 9B:
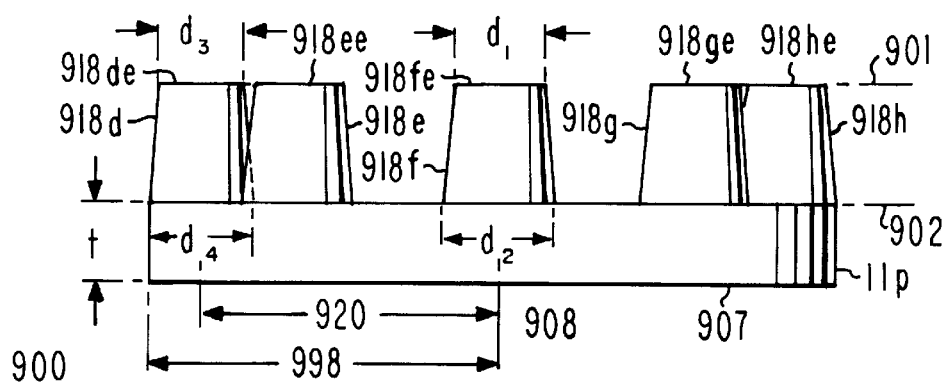
FIG. 9b is a side or elevation view of the transmission line of FIG. 9a, FIG. 9c illustrates the arrangement of FIG. 9a in encapsulated form.

With the unencapsulated short-circuited transmission-line 900 made as described in conjunction with FIGS. 9a, 9b, or with the encapsulated short-circuited transmission line 901 made as described in conjunction with FIGS. 9a, 9b, 9c, and 9d, the unencapsulated (900) or encapsulated transmission line (901) can then be made a part of a planar circuit. The unencapsulated short-circuited transmission line 900 of FIGS. 9a and 9b, or the encapsulated transmission line 901, is placed on a substrate 410 as illustrated for circuit 310 in FIG. 4a, with its exposed conductor ends 916e, 918ae, 918be, 918ce, 918de, 918ee, 918fe, and 918he adjacent substrate 410. The steps of FIGS. 4b, 4c, and 4d are followed.

Figure 9C:
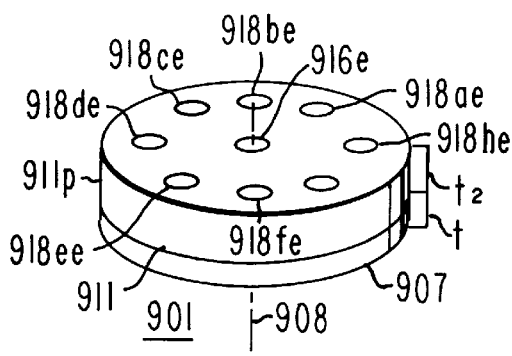
FIG. 9d is a side elevation of the capsulated structure of FIG. 9c.
Figure 9D:
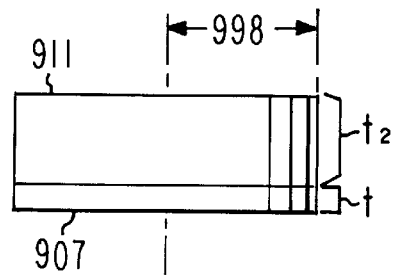
Figure 10A:
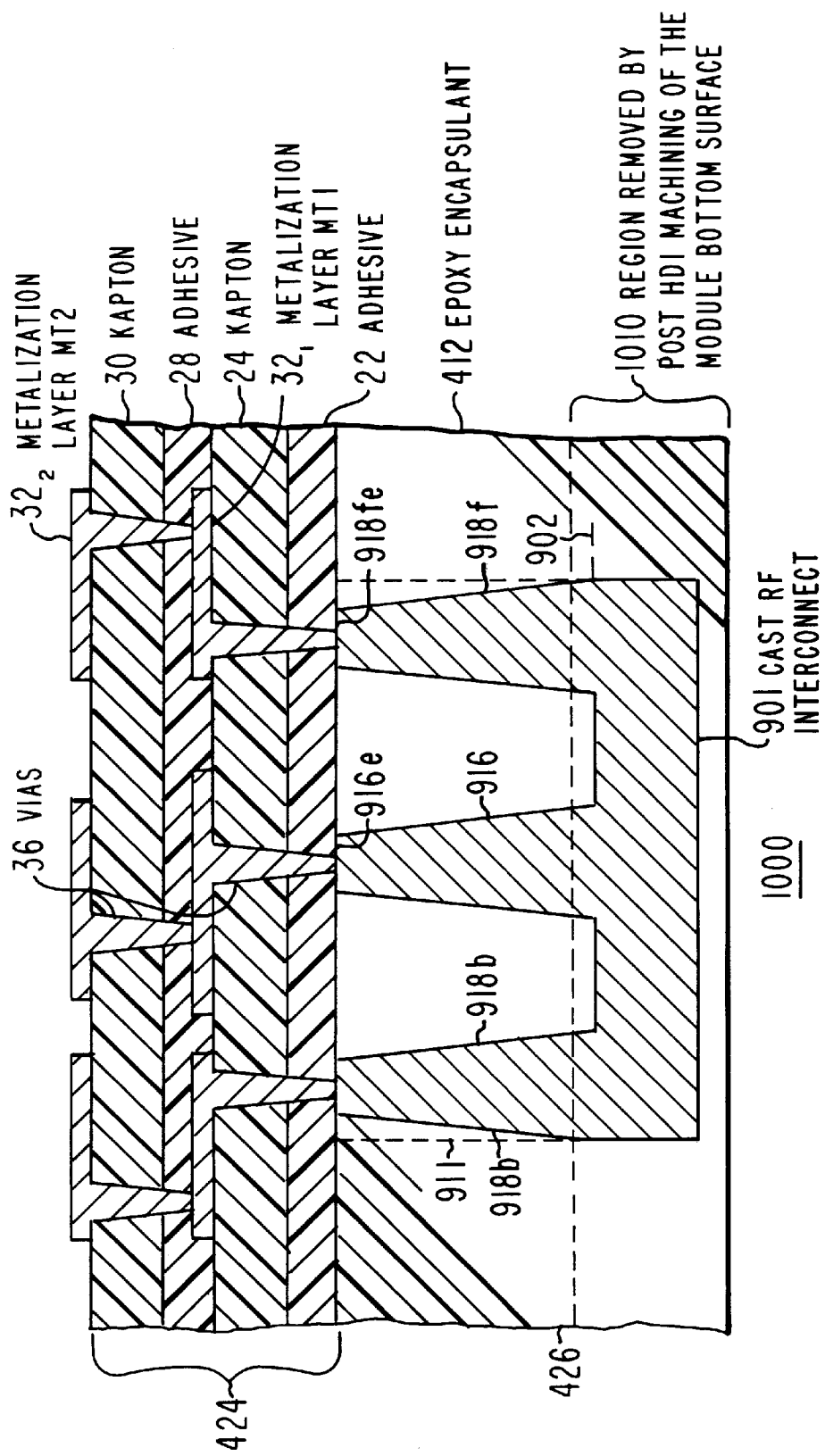
FIG. 10a illustrates the result of certain fabrication step corresponding to the steps of FIGS. 4a, 4b, 4c, and 4d applied to the short-circuited transmission line of FIGS. 9c and 9d.
Figure 10B:
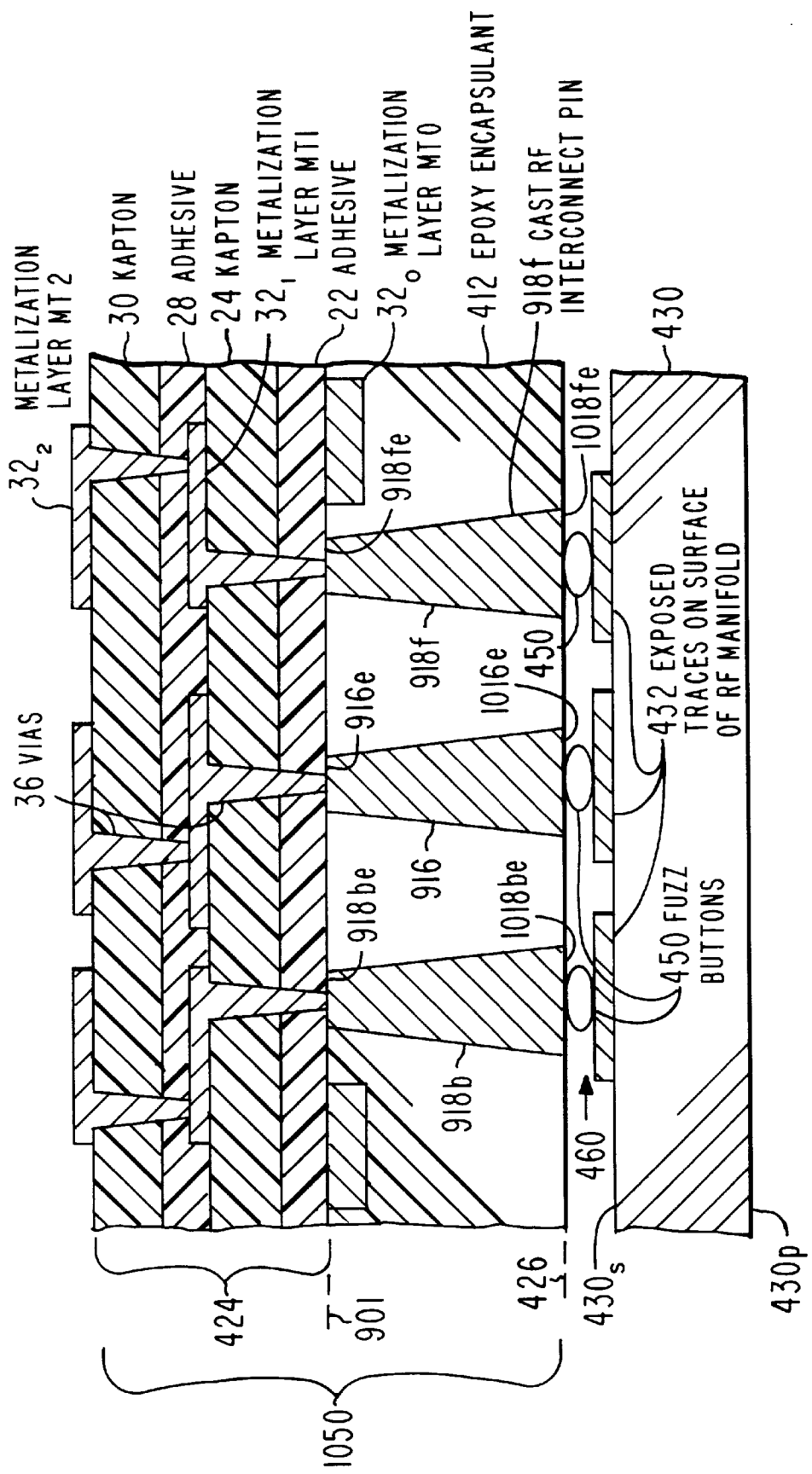

FIG. 10a is a simplified representation of the result of applying the steps of FIGS. 4a, 4b, 4c, and 4d to the encapsulated transmission line 901 of FIGS. 9a, 9b, and 9c. In FIG. 10a, elements corresponding to those of FIG. 4e are designated by like reference numerals, and elements corresponding to those of FIGS. 9a, 9b, 9c, and 9d are designated by like reference numerals. As illustrated in FIG. 10a, the planar circuit structure 1000, which may be an antenna array, has the location of the short-circuiting plate 907 below the parting plane 426 at which a cut is made to expose a newly formed end 1016e of the tapered center conductor and to also expose newly formed ends of the set of outer conductors 918, respectively. As illustrated in FIG. 10a, the parting plane lies between planes 903 and 902 associated with the RF interconnect 900. FIG. 10b is a simplified cross-section of a structure generally similar to that of FIG. 4h, in which the structure of FIG. 10a is the starting point; elements of FIG. 10b corresponding to those of FIG. 10a are designated by like reference numerals, and elements corresponding to those of FIG. 4h are designated by like reference numerals. It will be apparent to those skilled in the art that the structure of FIG. 10B is equivalent to that of FIG. 4h, with the sole difference lying in the tapered diameter of the center conductor 916 and of the outer conductors represented by 918b and 918f between the small ends 916e and newly formed large ends 1018be and 1018fe, respectively. This taper may change the characteristic impedance somewhat between the ends of the RF interconnect, but this effect is mitigated by the relatively small taper, and because the axial length of the RF interconnect is selected to be relatively short in terms of wavelength at the highest frequency of operation. Naturally, if one or more unencapsulated short-circuited transmission lines 900 are used to make the planar circuit according to the method described in conjunction with FIGS. 4a, 4b, 4c, 4d, 10a, and 10b, the dielectric constant of the encapsulant material of the transmission line is the same as that of the planar circuit itself. If an encapsulated transmission line such as 901 is used to make the planar circuit of FIG. 10b, it is desirable that the encapsulating materials be identical.

Figure 11:
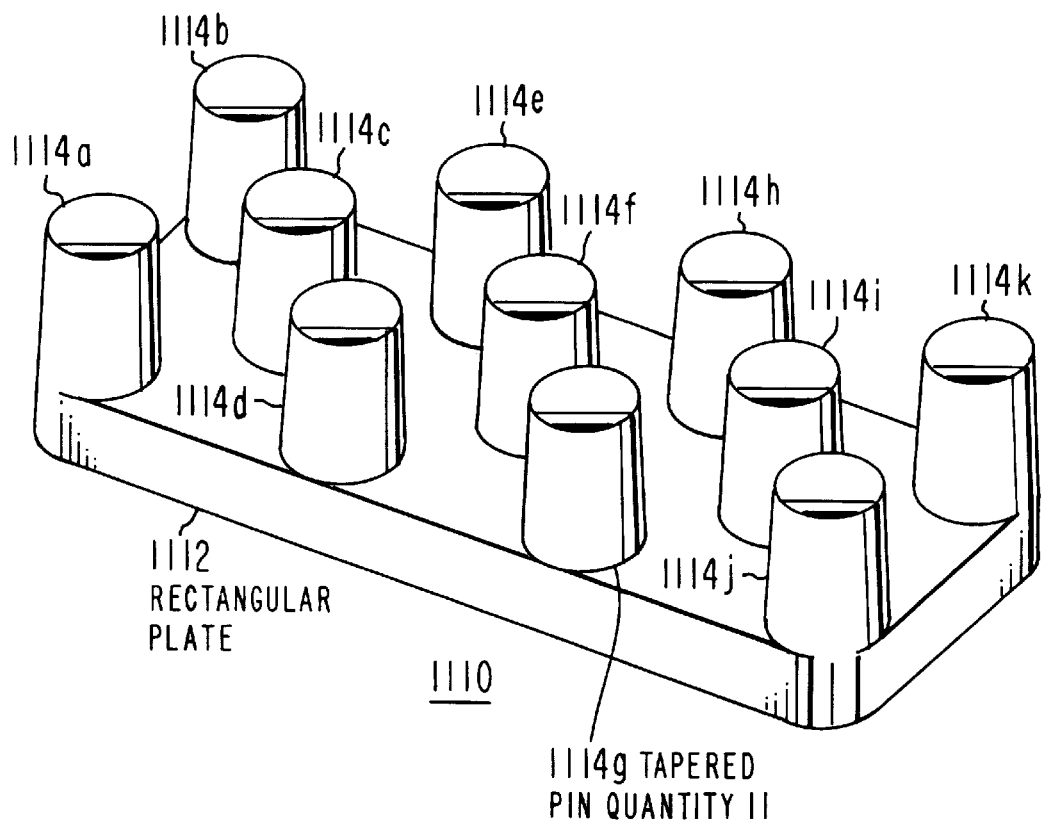
FIG. 11 illustrates a short-circuited multiple transmission line which may be encapsulated as described in conjunction with FIGS. 9c or 9d, and used for interconnecting planar circuit arrangements at frequencies somewhat lower than the higher RF frequencies, such as the clock frequencies of logic circuits.
Figure 12:
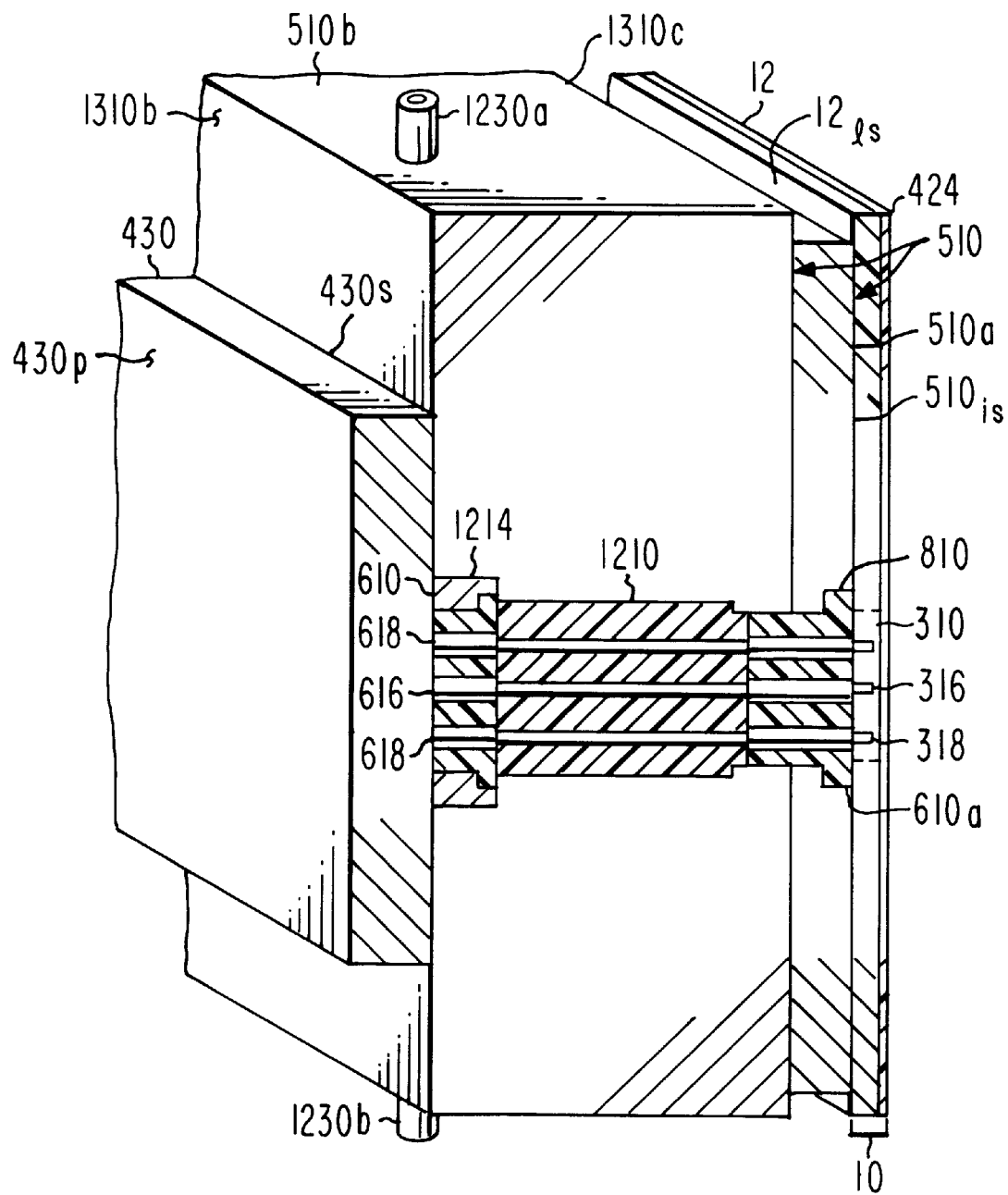
FIG. 12 is a perspective or isometric view of a structure according to an aspect of the invention, including a planar plastic HDI circuit, a bipartite separator plate, and a second planar circuit, some of which are cut away to reveal interior details.
Figure 13:
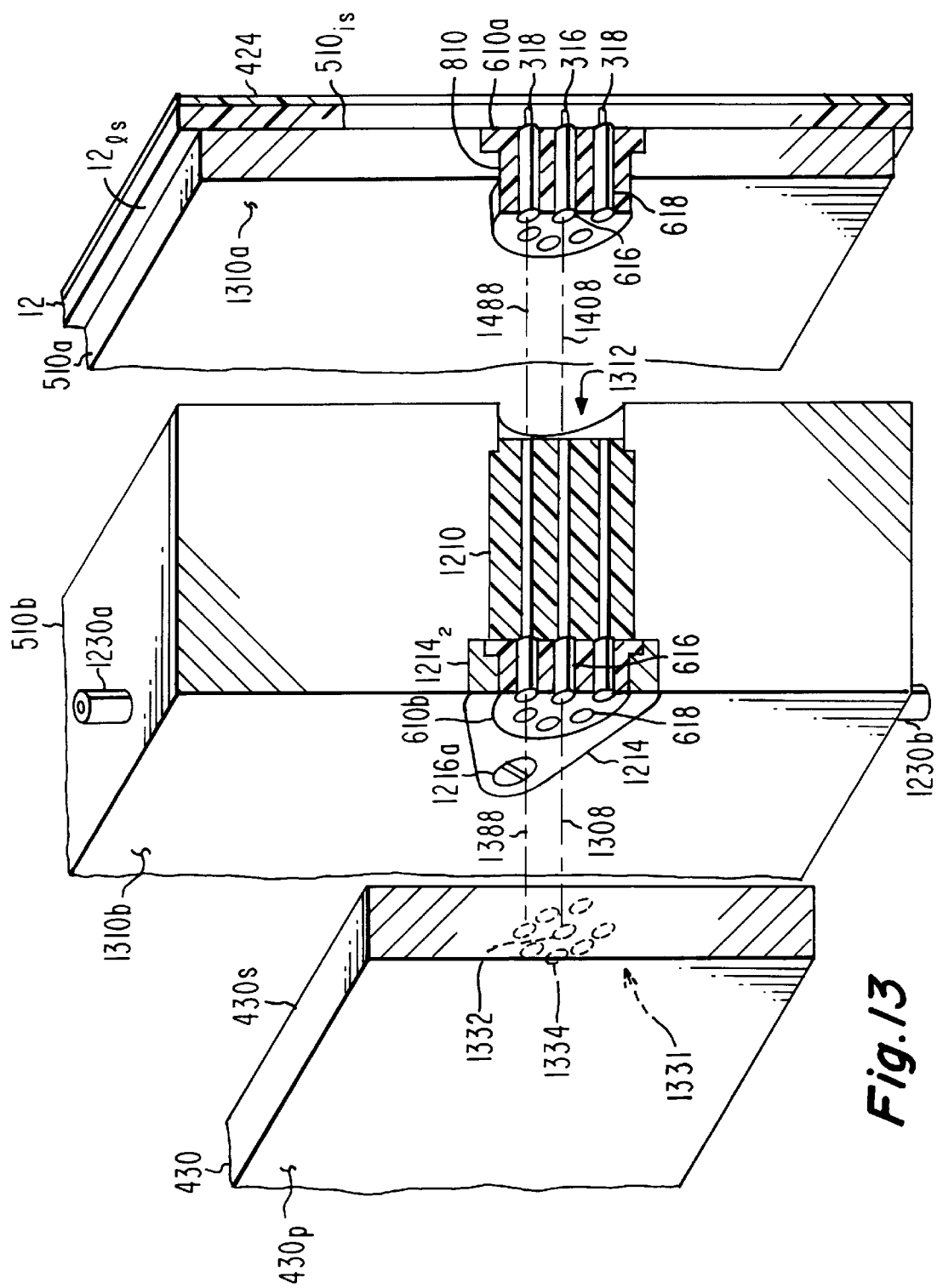
FIG. 13 is an exploded view of the structure of FIG. 12, showing the planar plastic HDI circuit associated with one portion of the separator plate as one part, the second portion of the separator plate, and the second planar circuit as other parts of the exploded structure.
Figure 14:
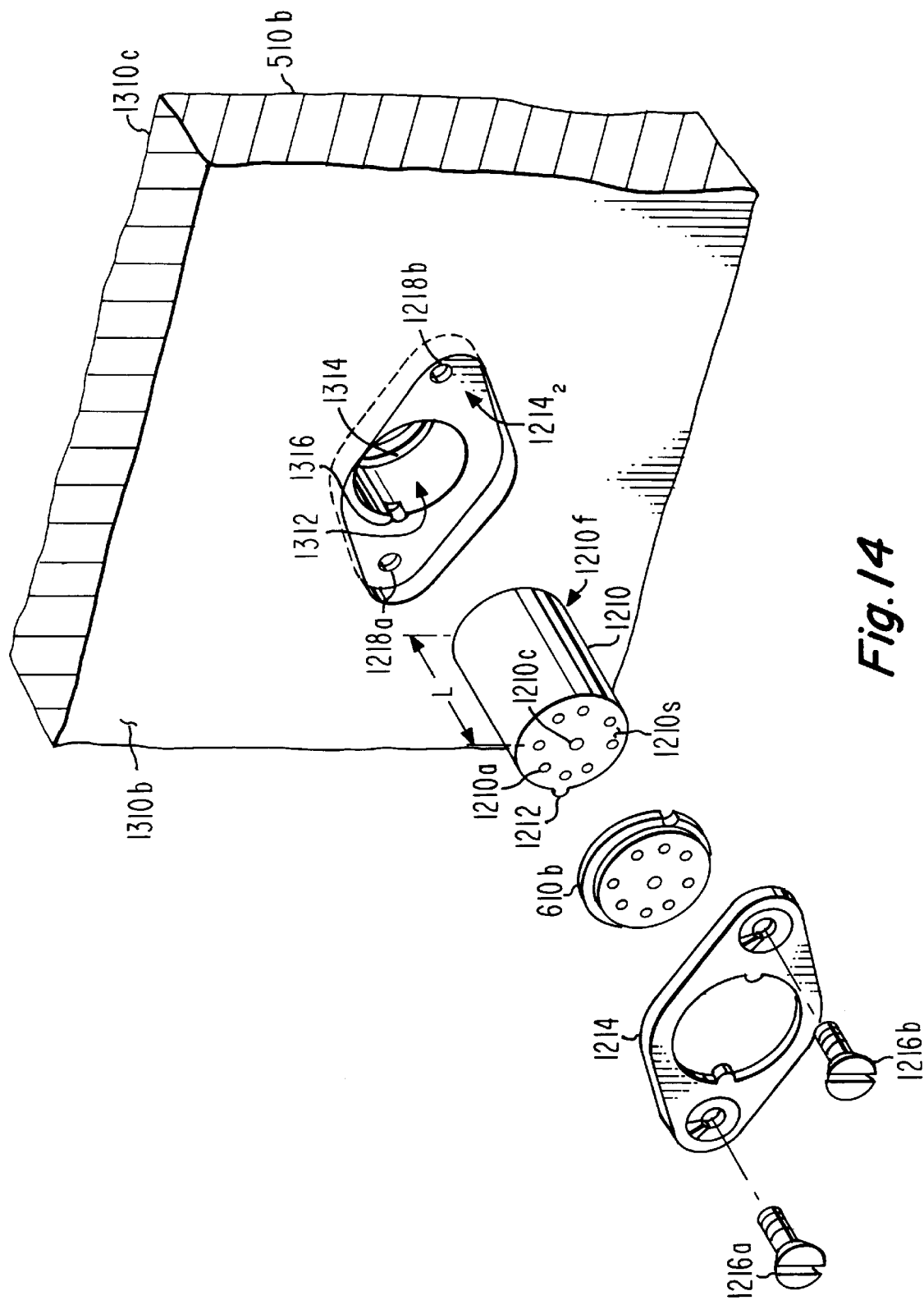
FIG. 14 is an exploded view of a portion of the second part of the separator plate, showing rigid and compliant transmission lines, and other structure.
Figure 15:
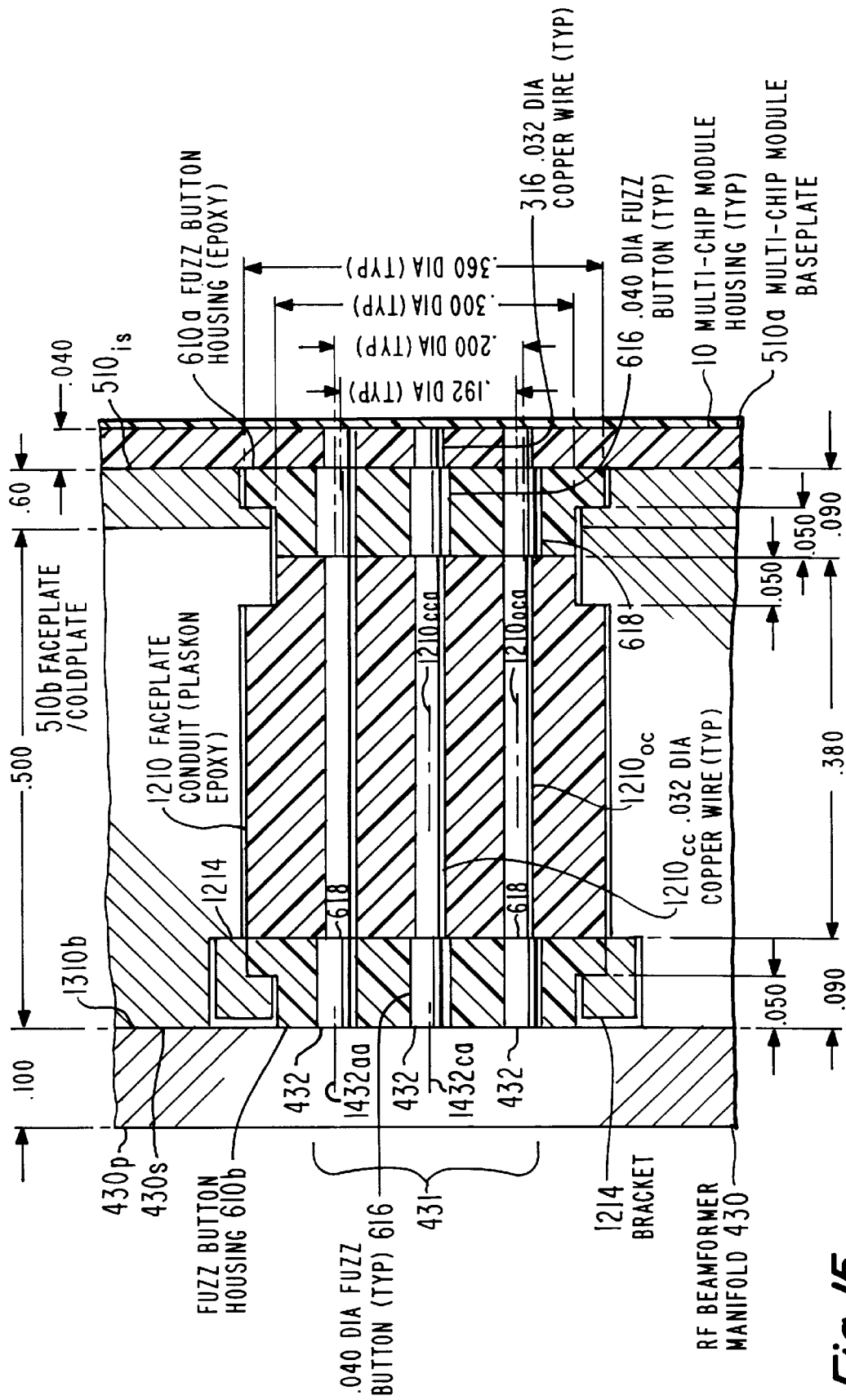
FIG. 15 is a more detailed cross-sectional view of the structure of FIG. 12.

FIG. 11 illustrates a monolithic electrically conductive structure which forms multiple short-circuited transmission paths, each consisting of at least one conductor paired with another; as known to those skilled in the art, one of the pair may be common with other circuit paths, and may be used at somewhat lower frequencies than the coaxial structures, down to zero frequency. In FIG. 11, the multiple short-circuited transmission paths take the form of a monolithic electrically conductive structure 1110, including a baseplate 1112 and a plurality, eleven in number, of tapered pins or posts 1114a, 1114b, 1114c, 1114d, 1114e, 1114f, 1114g, 1114h, 1114i, 1114j, and 1114k. The short-circuited multiple transmission-line structure is used instead of the coaxial arrangement 900 in the method described in conjunction with FIGS. 4a, 4b, 4c, 4d, 10a, and 10b, to make a planar structure. Those skilled in the art know that antenna array/ beamformer combinations require not only connection of RF signals, but also require transmission between elements of power and control signals, which can be handled by the structure made with the multiple transmission paths of FIG. 11.

FIGS. 12, 13, 14, and 15 illustrate a planar plastic HDI circuit 10 similar to those described in conjunction with FIGS. 3a, 3b, 3c, 4a, 4b, 4c, 4d, 4e, 4f, and 4g. More particularly, planar plastic HDI circuit 10 includes a molded interconnect 310 such as that described in conjunction with FIGS. 3a, 3b, and 3c, assembled to the substrate 12 as described in conjunction with FIGS. 4a, 4b, 4c, 4d, 4e, 4f, and 4g. The planar plastic HDI circuit 10 is mounted on a stiffening plate 510a, which is part of a bipartite separation plate 510. First portion 510a of the bipartite separation plate 510 has an aperture 810 formed therein to accommodate the flanged disk-like body of compliant interconnect 610, with the fuzz-button conductors 616, 618 of the compliant interconnect registered with the conductors of molded interconnect 310 so as to be in contact therewith.

Second portion 510b of separation plate 510 of FIGS. 12, 13, 14, and 15 has a through aperture 1312 including a cylindrical portion, and also including a recess $1214_2$ adjacent side 1310b of second portion 510b of separation plate 510, which recess accommodates a hold-down flange 1214. Through aperture 1312 also includes a lip or flange 1314 adjacent side 1310c, which aids in holding the body of a rigid coaxial transmission line 1210 in place. Rigid coaxial transmission line 1210 is similar to molded interconnect 310, but may be longer, so as to be able to carry signals through the first and second portions of the separation plate 510. Aperture 1312 also defines a key receptacle 1316 which accepts a key 1212 protruding from the body of rigid transmission line 1210. The number of conductors of rigid transmission line 1210 is selected, and the conductors are oriented about the longitudinal axis of the rigid transmission line, in such a manner as, when keyed into the aperture 1312 in separation plate 510, the conductors each match and make contact with corresponding conductors of compliant interconnects 610a and 610b. Compliant interconnect 610a is compressed between molded interconnect 310 and rigid coaxial transmission line 1210, and is oriented to make the appropriate connections between the center fuzz button 616 of molded interconnect 610a and the center conductor 1210c, and between the outer fuzz buttons 618 of molded interconnect 610a and the outer conductors, one of which is designated 1210o, of the rigid transmission line 1210.

Molded interconnect 610b of FIGS. 12, 13, 14, and 15 is compressed between a surface 1210s of rigid transmission line 1210 and face 430s of second circuit 430, and, when the second circuit 430 is registered with separation plate 510, the center and outer metallizations 1332 and 1334, respectively, of its coaxial port 1331 are registered with the corresponding center fuzz button 616 and outer fuzz buttons 618 of compliant interconnect 610b. The second compliant interconnect 610b is held in place by flange 1214, which in turn is held down by screws 1216a and 1216b in threaded apertures 1218a and 1218b, respectively.

It will be clear from FIGS. 12, 13, 14, and 15 that when the center axis 308 of the center-conductor connection 316c of port 490 of the HDI circuit 10 are coaxial with the axis 1308 of the center-conductor connection 1332 of the port 1331 of the beamformer or second circuit 430, and with the axes 1408, 1210cca, and 1432ca of the center conductors of the first compliant interconnect 610a, the rigid transmission line 1210, and the second compliant interconnect 610b, and the compliant interconnects are of sufficient length, an electrically continuous path will be made between the two center conductor contacts. Similarly, with the center conductors and center conductor contacts coaxial, all that is required to guarantee that the outer conductors make corresponding contact is that they have the same number and be equally spaced about the center conductors, and that one of the outer conductors or outer conductor contacts in each piece lie in a common plane with the common axes of the center conductors. When any one of the eight outer conductors or contacts of any one of the interconnection elements is aligned with the corresponding others, all of the outer conductors or outer conductor contacts is also aligned with its corresponding elements.

In the particular embodiment of the invention illustrated in FIGS. 12, 13, 14, and 15, the separation plate 510 consists of a stiffener plate 510a which is adhesively or otherwise held to the otherwise flexible plastic HDI circuit 12, and the second portion 510b of separator plate 510 is a cold plate, which includes interior chambers (not illustrated) into which chilled water or other coolant may be introduced by pipes illustrated as 1230a and 1230b. In a particular embodiment of the invention, the planar plastic HDI circuit (only a portion illustrated) defines an antenna array, and the MMIC (not illustrated in FIGS. 12, 13, 14, and 15) associated with the planar plastic HDI circuit include chips operated as active amplifiers for the antenna elements. The second circuit 430 is part of a beamformer which supplies signals to, and receives signals from, the MMIC associated with the planar plastic HDI circuit 12.

Other embodiments of the invention will be apparent to those skilled in the art. For example, while the described flat antenna structure lies in a plane, it may be curved to conform to the outer contour of a vehicle such as an airplane, so that the flat antenna structure takes on a three-dimensional curvature. It should be understood that an active antenna array may, for cost or other reasons, define element locations which are not filled by actual antenna elements, such an array is termed "thinned." The term "RF" has been used to indicate frequencies which may make use of the desirable characteristics of coaxial transmission lines; this term is meant to include all frequencies, ranging from a few hundred kHz to at least the lower infrared frequencies, about $10^{13}$ Hz., or even higher if the physical structures can be made sufficiently exactly. While the short transmission line illustrated in FIGS. 3a, 3b, and 3c has eight outer conductors, the number may greater or lesser. The dielectric constant of the dielectric conductor holder of the short transmission lines is selected to provide the proper impedance, whereas the specified ranges are suitable for 50 ohms. While the cold plate has been described as being for carrying away heat generated by chips in the first planar circuit 10, it will also carry away heat from the distribution beamformer. While the diameters of the center and outer conductors have been illustrated as being equal, the center conductor may have a different diameter or taper than the outer conductors, and the outer conductors may even have different diameters among themselves.

Thus, a short-circuited transmission line (900) according to an aspect of the invention includes a monolithic, electrically conductive structure including (a) a solid center conductor (916) having a circular cross-section about a central axis (908). The center conductor (916) terminates at a first plane (901) and has a first diameter (d1) at the first plane (901) in a direction transverse to the central axis (908), and a second diameter (d2), greater than the first diameter (d1), at a second plane (902) parallel to the first plane (901). The diameter of the center conductor (916) tapers monotonically between the first (d1) and second (d2) diameters. The length of the center conductor (916) is defined by the separation of the first (901) and second (902) planes. The monolithic structure further includes (b) a plurality (eight, in the illustrated embodiment) of mutually identical solid outer conductors (918a, 918b, 918c, 918d, 918e, 918f, 918g, and 918h). Each one of the outer conductors (918a, 918b, 918c, 918d, 918e, 918f, 918g, and 918h) has a circular cross-section about a longitudinal axis (such as axis 910aa). The longitudinal axes (such as 918aa) of the outer conductors (918a, 918b, 918c, 918d, 918e, 918f, 918g, and 918h) are parallel with the central axis (908) of the center conductor (916). Each of the outer conductors (918a, 918b, 918c, 918d, 918e, 918f, 918g, and 918h) terminates at the first plane (901), and has a third diameter (d3) at the first plane (901), and a fourth diameter (d4), greater than the third diameter (d3), at the second plane (902). The diameter of each of the outer conductors (918a, 918b, 918c, 918d, 918e, 918f, 918g, and 918h) tapers monotonically between the first (d1) and second (d2) diameters. The outer conductors (918a, 918b, 918c, 918d, 918e, 918f, 918g, and 918h) have their longitudinal axes (such as 918aa) equally spaced from each other at radii (920) from the center axis (908) which make equal angles (45° in the case of eight outer conductors) with adjacent radii (920). The monolithic structure also includes (c) a solid short-circuiting plate (907) interconnecting the center conductor (916) and the outer conductors (918a, 918b, 918c, 918d, 918e, 918f, 918g, and 918h) at the second plane (902).

In one embodiment of the short-circuited transmission line, a disk-like dielectric insulator (911) encapsulates the monolithic structure. The insulator (911) defines a central axis (908) coincident with the central axis (908) of the center conductor (916), and also defines a thickness (t2) sufficient to enclose that portion of the center and outer conductors (918a, 918b, 918c, 918d, 918e, 918f, 918g, and 918h) lying between the first (901) and second (902) planes, and further defines a periphery (911p), at least in part, by a radius (998) from the central axis (908) sufficient to encapsulate the sides of the outer conductors at their largest diameter, which is a radius (998) which is greater than the sum of (a) one of the radii (920) plus (b) half of the greater of (i) the second diameter (d2) and (ii) the fourth diameter (d4).

In one embodiment of the invention, the second (d2) and fourth diameters (d4) are equal, so the radius (998) of the encapsulating insulator (911) is equal to the radius of the circle (921) on which the axes (such as 918aa) of the outer conductors (918a, 918b, 918c, 918d, 918e, 918f, 918g, and 918h) lie, plus half the diameter (d2) of a conductor at the second plane (902). The insulator (911) surrounds at least portions of the center (916) and outer conductors (918a, 918b, 918c, 918d, 918e, 918f, 918g, and 918h), for insulating the center conductor (916) from the outer conductors (918a, 918b, 918c, 918d, 918e, 918f, 918g, and 918h) and the outer conductors (918a, 918b, 918c, 918d, 918e, 918f, 918g, and 918h) from each other, except at the short-circuiting plate (907). In a particular embodiment of the invention, the third diameter (d3) equals the first diameter (d1), and the fourth diameter (d4) equals the second diameter (d2), and the taper of the diameters of the center and outer conductors (918a, 918b, 918c, 918d, 918e, 918f, 918g, and 918h) is linear. In another embodiment of the invention, the short-circuiting plate (907) has a thickness (t) no greater than the length of the center conductor (916). The periphery of the short-circuiting plate (907) may be the same as that of the insulator (911), which is to say that it is defined by a radius measured from the central axis (908) of the center conductor (916), which radius is equal to the sum of (a) one of the radii (920) plus (b) half of the greater of (i) the second diameter (d2) and (ii) the fourth diameter (d4). In yet another embodiment, the length of the center conductor (916) is no greater than the diameter of the dielectric insulator (911). The dielectric insulator (911), if used, may be either rigid or deformable, as for example an elastomer.

A method for producing a flat circuit structure, which may be an antenna array, according to another aspect of the invention, includes the step of affixing a plurality of microwave integrated-circuit chips (14) to a planar support (410), with connections (14$_1$, 14$_2$) of the chips (14) adjacent to the support (410). A short-circuited electrical transmission-line is procured. The short-circuited electrical transmission-line includes (i) a monolithic, electrically conductive structure (900) which includes (a) a solid center conductor (916) having a circular cross-section about a central axis (908), and terminating in a first end (916e) at a first plane (901). The center conductor (916) has a first diameter (d1) at a first plane (901) transverse to the central axis (908), and a second diameter (d2), greater than the first diameter (d1), at a second plane (902) parallel to the first plane (901). The diameter of the center conductor (916) tapers monotonically between the first (d1) and second (d2) diameters. The length of the center conductor (916) is defined by the separation of the first (901) and second (902) planes, (b) a plurality (eight) of mutually identical solid outer conductors (918a, 918b, 918c, 918d, 918e, 918f, 918g, and 918h). Each one of the outer conductors (918a, 918b, 918c, 918d, 918e, 918f, 918g, and 918h) has a circular cross-section about a longitudinal axis (such as axis 918aa), and the longitudinal axes (such as axis 918aa) of the outer conductors (918a, 918b, 918c, 918d, 918e, 918f, 918g, and 918h) lie parallel with the central axis (908) of the center conductor (916). Each of the outer conductors (918a, 918b, 918c, 918d, 918e, 918f, 918g, and 918h) terminates at a first end at the first plane (901), and the first ends of each of the outer conductors (918a, 918b, 918c, 918d, 918e, 918f, 918g, and 918h) have a third diameter (d3) at the first plane (901). The outer conductors (918a, 918b, 918c, 918d, 918e, 918f, 918g, and 918h) have a fourth diameter (d4), greater than the third diameter (d3), at the second plane (902). The diameter of the outer conductors (918a, 918b, 918c, 918d, 918e, 918f, 918g, and 918h) tapers monotonically between the third (d3) and fourth (d4) diameters. The outer conductors (918a, 918b, 918c, 918d, 918e, 918f, 918g, and 918h) have their longitudinal axes (such as axis 918aa) equally spaced from each other at radii (920) which make equal angles (45° for the case of eight outer conductors) with adjacent radii (920).

(c) a solid short-circuiting plate (907) interconnecting the center conductor (916) and the outer conductors (918a, 918b, 918c, 918d, 918e, 918f, 918g, and 918h) at the second plane (902).

The electrical transmission line (900) may also include (ii) a disk-like dielectric insulator (911) defining a central axis coincident with the central axis (908) of the center conductor (916), and a thickness sufficient to enclose that portion of the center and outer conductors (918a, 918b, 918c, 918d, 918e, 918f, 918g, and 918h) lying between the first (901) and second (902) planes. The periphery (911p) of the disk-like dielectric insulator (911) is defined, at least in part, by a radius (998) from the central axis (908) which is sufficient to enclose the all the outer conductors (918a, 918b, 918c, 918d, 918e, 918f, 918g, and 918h) at their greatest diameter. This radius (998) is no less than the sum of (a) one of the radii (920) plus (b) half of the greater of (i) the third diameter (d3) and (ii) the fourth diameter (d4). The insulator (911) surrounds at least portions of the center and outer conductors (918a, 918b, 918c, 918d, 918e, 918f, 918g, and 918h) in the axial direction, for electrically insulating the center conductor (916) from the outer conductors (918a, 918b, 918c, 918d, 918e, 918f, 918g, and 918h) and the outer conductors (918a, 918b, 918c, 918d, 918e, 918f, 918g, and 918h) from each other, but no electrical isolation between the conductors exists at the short-circuiting plate (907).

The method includes the step of applying the short-circuited transmission line (900) to the support (410) with the first ends (916e, 918xe, where x ranges from a to h) of the center (916) and outer conductors (918a, 918b, 918c, 918d, 918e, 918f, 918g, and 918h) adjacent the support (410), and encapsulating the chips (14) and the short-circuited transmission line (900) in rigid dielectric material (412), to thereby produce a structure (FIG. 4c) including an encapsulated chip (14) and transmission line (900). At least portions of the support (410) are removed from the encapsulated chip (14) and transmission line (900), to thereby expose at least portions of the first side of the encapsulated chip (14) and transmission line (900), including at least the connections (14$_1$, 14$_2$) of the chips (14) and the first ends (916e, 918xe) of the center (916) and outer (918a, 918b, 918c, 918d, 918e, 918f, 918g, and 918h) conductors of the short-circuited transmission line (900). At least one of the connections (14$_1$, 14$_2$) of at least one of the chips (14) is interconnected (by way of paths 32$_1$ and vias 36) with the first end (916e) of the center conductor (916) of the short-circuited transmission line (900), and at least one other of the connections (14$_1$, 14$_2$) of the one of the chips (14) is interconnected to the first ends (918xe) of all of the outer conductors (918a, 918b, 918c, 918d, 918e, 918f, 918g, and 918h) of the transmission-line, by way of conductive traces and through vias, to thereby produce a first-side-connected encapsulated arrangement (FIGS. 4d, 10a). This may be accomplished by connecting the traces of a layer (424) of flexible dielectric sheet carrying a plurality of electrically conductive traces (32$_1$, 322) applied to the first side of the encapsulated chip (14) and short-circuited transmission line (900). At least so much material (1010) is removed (FIGS. 10a, 10b) from that side of the first-side-connected encapsulated arrangement (FIG. 4d) remote from the first side as will expose separated second ends (1016e, 1018xe), remote from the first ends (916e, 918xe), of the center (916) and outer conductors (918a, 918b, 918c, 918d, 918e, 918f, 918g, and 918h) of the transmission line, and to thereby eliminate the short-circuit, to thereby produce a first planar arrangement (1050 of FIG. 10b) having exposed second ends (1016e, 1018xe) of the center (916) and outer conductors (918a, 918b, 918c, 918d, 918e, 918f, 918g, and 918h) of the transmission line. A planar conductor arrangement (430) including a plurality of individual electrical connections (432) is applied over the first planar arrangement (1050), adjacent the side of the first planar arrangement with exposed second ends (1016e, 1018xe) of the center (916) and outer conductors (918a, 918b, 918c, 918d, 918e, 918f, 918g, and 918h). The electrical connections (432) of the planar conductor arrangement (430) are selected so that, when the planar conductor arrangement (430) is registered with the first planar arrangement (1050), the electrical connections (432) are registered with the center (916) and outer conductors (918a, 918b, 918c, 918d, 918e, 918f, 918g, and 918h) of the transmission line. The planar conductor arrangement (430) is registered with the first planar arrangement (1050), and electrical connections (450) are made between the second ends (1016e, 1018xe) of the center (916) and outer conductors (918a, 918b, 918c, 918d, 918e, 918f, 918g, and 918h) of the transmission line (900) of the first planar arrangement (1050) and the connections (432) of the planar conductor arrangement (430).

In a particular method according to an aspect of the invention, the step of making electrical connections includes the steps of placing a compressible floccule (fuzz buttons) of electrically conductive material between the second ends (1016e, 1018xe) of each of the center (916) and outer conductors (918a, 918b, 918c, 918d, 918e, 918f, 918g, and 918h) of the transmission line of the first planar arrangement (1050) and the registered ones of the electrical connections (432) of the planar conductor arrangement (430), and compressing the compressible floccule of electrically conductive material between the second ends (1016e, 1018xe) of the center (916) and outer conductors (918a, 918b, 918c, 918d, 918e, 918f, 918g, and 918h) of the transmission line of the first planar arrangement (1050) and the registered ones of the electrical connections (432) of the planar conductor arrangement (430), to thereby establish the electrical connections and to aid in holding the compressible floccules (450) in place. In a preferred embodiment of the invention, the method encapsulates the chips (14) and the short-circuited transmission line (900) in the same dielectric material (412) used in the dielectric disk (911).

What is claimed is:

1. A method for producing a flat circuit arrangement, comprising the steps of:
    affixing a plurality of microwave integrated-circuit chips to a planar support, with connections of said chips adjacent to said support;
    procuring a short electrical transmission-line, comprising:
        (i) a monolithic, electrically conductive structure including
            (a) a solid center conductor having a circular cross-section about a central axis, said center conductor terminating in a first end at a first plane, and having a first diameter at said first plane transverse to said central axis, and a second diameter, greater than said first diameter, at a second plane parallel to said first plane, said diameter of said center conductor tapering monotonically between said first and second diameters, and the length of said center conductor being defined by the separation of said first and second planes;
            (b) a plurality of mutually identical solid outer conductors, each one of said outer conductors having a circular cross-section about a longitudinal axis, said longitudinal axis of each of said outer conductors being parallel with said central axis of said center conductor, and each of said outer conductors terminating at a first end at said first plane, and having a third diameter at said first plane, and a fourth diameter, greater than said third diameter, at said second plane, said diameter of said outer conductors tapering monotonically between said third and fourth diameters, and said plurality of outer conductors having said longitudinal axes equally spaced from each other at radii which make equal angles with adjacent radii; and
            (c) a solid short-circuiting plate interconnecting said center conductor and said outer conductors at said second plane;
    applying said short transmission-line to said support with said first ends adjacent said support;
    encapsulating said chips and said short transmission-line in rigid dielectric material, to thereby produce encapsulated chip and transmission-line;
    removing at least a portion of said support from said encapsulated chip and transmission-line, to thereby expose at least portions of a first side of said encapsulated chip and transmission-line, including at least said connections of said chips and said first ends of said center and outer conductors of said short transmission-line;
    electrically interconnecting, by way of some of electrically conductive traces and through vias, at least one of said connections of at least one of said chips with said first end of said center conductor of said transmission-line, and at least one other of said connections of said one of said chips to said first ends of all of said outer conductors of said transmission-line, to thereby produce a first-side-connected encapsulated arrangement;
    removing at least so much material from that side of said first-side-connected encapsulated arrangement remote from said first side as will expose separated second ends of said center and outer conductors of said transmission-line, to thereby produce a first planar arrangement having exposed second ends of said center and outer conductors of said transmission-line;
    applying, over said first planar arrangement, adjacent said side of said first planar arrangement with exposed second ends of said center and outer conductors, a planar conductor arrangement including a plurality of individual electrical connections which, when said planar conductor arrangement is registered with said first planar arrangement, are registered with said center and outer conductors of said transmission-line;
    registering said planar conductor arrangement with said first planar arrangement; and
    making electrical connections between said second ends of said center and outer conductors of said transmission line of said first planar arrangement and said connections of said planar conductor arrangement.

2. A method according to claim 1, wherein said step of making electrical connections comprises the steps of:
    placing, between said second ends of each of said center and outer conductors of said transmission line of said first planar arrangement and the registered ones of said electrical connections of said planar conductor arrangement, a compressible floccule of electrically conductive material; and
    compressing said compressible floccule of electrically conductive material between said second ends of said center and outer conductors of said transmission lines of said first planar arrangement and the registered ones of said electrical connections of said planar conductor arrangement, to thereby establish said electrical connections and to aid in holding said compressible floccules in place.

3. A method according to claim 1, wherein said flat circuit arrangement comprises an antenna array associated with said first planar arrangement, and said planar conductor arrangement comprises a planar beamformer coupled to said antenna array.

4. A method according to claim 1, wherein said step of encapsulating said chips and said short transmission-line in dielectric material includes the step of encapsulating said chips and said short transmission-line in the same dielectric material as that of said dielectric disk.

5. A method according to claim 4, wherein said step of procuring a short electrical transmission-line includes the step of procuring a short electrical transmission line including said center conductor, outer conductors, short-circuiting plate, and further including (ii) a disk-like dielectric insulator defining a central axis coincident with said central axis of said center conductor, a thickness sufficient to enclose that portion of said center and outer conductors lying between said first and second planes, and a periphery defined, at least in part, by a radius from said central axis no less than the sum of (a) one of said radii plus (b) half of the greater of (i) said second diameter and (ii) said fourth diameter, said insulator surrounding at least portions of said center and outer conductors, for insulating said center conductor from said outer conductors and said outer conductors from each other, except at said short-circuiting plate.

6. A method for producing a flat circuit arrangement, comprising the steps of:

affixing a plurality of integrated-circuit chips to a planar support, with connections of said chips adjacent to said support;

procuring a short electrical multiple transmission path, comprising:

(i) a monolithic, electrically conductive structure including (a) a solid first conductor having a circular cross-section about a central axis, said first conductor terminating in a first end at a first plane, and having a first diameter at said first plane transverse to said central axis, and a second diameter, greater than said first diameter, at a second plane parallel to said first plane, said diameter of said first conductor tapering monotonically between said first and second diameters, and the length of said first conductor being defined by the separation of said first and second planes;

(b) a plurality of mutually identical solid additional conductors, each one of said additional conductors having a circular cross-section about a longitudinal axis, said longitudinal axis of each of said additional conductors being parallel with said central axis of said first conductor, and each of said additional conductors terminating at a first end at said first plane, and having a third diameter at said first plane, and a fourth diameter, greater than said third diameter, at said second plane, said diameter of said additional conductors tapering monotonically between said third and fourth diameters, and said plurality of additional conductors having said longitudinal axes arrayed so as to be equally spaced from said first conductor and each other; and (c) a solid short-circuiting plate interconnecting said first conductor and said additional conductors at said second plane;

applying said short multiple transmission path to said support with said first ends adjacent said support;

encapsulating said chips and said short multiple transmission path in rigid dielectric material, to thereby produce encapsulated chip and multiple transmission path;

removing at least portions of said support from said encapsulated chip and multiple transmission path, to thereby expose portions of said first side of said encapsulated chip and multiple transmission path, including at least said connections of said chips and said first ends of said first and additional conductors of said short multiple transmission path;

interconnecting, by way of conductive traces and through vias, at least one of said connections of at least one of said chips with said first end of said first conductor of said multiple transmission path, and at least one other of said connections of said one of said chips to said first end of at least one of said additional conductors of said multiple transmission path, to thereby produce a first-side-connected encapsulated arrangement;

removing at least so much material from that side of said first-side-connected encapsulated arrangement remote from said first side as will expose separated second ends of said first and additional conductors of said multiple transmission path, to thereby produce a first planar arrangement having exposed second ends of said first and additional conductors of said multiple transmission path;

applying, over said first planar arrangement, adjacent said side of said first planar arrangement with exposed second ends of said first and additional conductors, a planar conductor arrangement including a plurality of individual electrical connections which, when said planar conductor arrangement is registered with said first planar arrangement, are registered with said first and additional conductors of said multiple transmission path;

registering said planar conductor arrangement with said first planar arrangement; and making electrical connections between said second ends of said first and additional conductors of said transmission line of said first planar arrangement and said connections of said planar conductor arrangement.

7. A method according to claim 6, wherein said step of making electrical connections comprises the steps of:

placing, between said second ends of each of said first and additional conductors of said multiple transmission path of said first planar arrangement and the registered ones of said electrical connections of said planar conductor arrangement, a compressible floccule of electrically conductive material; and compressing said compressible floccule of electrically conductive material between said second ends of said first and additional conductors of said multiple transmission path of said first planar arrangement and the registered ones of said electrical connections of said planar conductor arrangement, to thereby establish said electrical connections and to aid in holding said compressible floccules in place.

8. A method according to claim 6, wherein said step of procuring a short electrical multiple transmission path includes the step of procuring a short electrical multiple transmission path including (ii) a dielectric insulator having a thickness sufficient to enclose that portion of said first and additional conductors lying between said first and second planes, and a periphery defined by the shape of said array of conductors, said insulator surrounding at least portions of said first and additional conductors, for insulating said first conductor from said additional conductors and said additional conductors from each other, except at said short-circuiting plate.

9. A method according to claim 6, wherein said step of encapsulating said chips and said multiple transmission path in dielectric material includes the step of encapsulating said chips and said multiple transmission path in the same dielectric material as that of said dielectric insulator.

10. A method according to claim 6, wherein said flat circuit arrangement comprises an antenna array associated with said first planar arrangement, and said planar conductor arrangement comprises a planar beamformer coupled to said antenna array.

* * * * *